US012562762B2

(12) United States Patent
Beikmirza et al.

(10) Patent No.: US 12,562,762 B2
(45) Date of Patent: Feb. 24, 2026

(54) DIGITAL TRANSMITTER FEATURING A 50%-LO SIGNED PHASE MAPPER

(71) Applicant: TECHNISCHE UNIVERSITEIT DELFT, Delft (NL)

(72) Inventors: Mohammad Reza Beikmirza, Delft (NL); Leonardus Cornelis Nicolaas de Vreede, Delft (NL); Robert Jan Bootsman, Delft (NL); Dieuwert Peter Nicolaas Mul, Delft (NL); Seyed Morteza Alavi, Delft (NL); Yiyu Shen, Delft (NL)

(73) Assignee: Technische Universiteit Delft, Delft (NL)

( * ) Notice: Subject to any disclaimer, the term of this patent is extended or adjusted under 35 U.S.C. 154(b) by 120 days.

(21) Appl. No.: 18/263,895

(22) PCT Filed: Feb. 4, 2022

(86) PCT No.: PCT/NL2022/050054
§ 371 (c)(1),
(2) Date: Aug. 2, 2023

(87) PCT Pub. No.: WO2022/169361
PCT Pub. Date: Aug. 11, 2022

(65) Prior Publication Data
US 2024/0146503 A1      May 2, 2024

(30) Foreign Application Priority Data
Feb. 5, 2021      (NL) ...................................... 2027509

(51) Int. Cl.
*H04B 1/04*      (2006.01)
*H03F 3/20*      (2006.01)

(52) U.S. Cl.
CPC ................. *H04B 1/04* (2013.01); *H03F 3/20* (2013.01)

(58) Field of Classification Search
CPC .... H04B 1/02; H04B 1/04; H04B 2001/0408; H04B 2001/0416; H04B 2001/045;
(Continued)

(56) References Cited

U.S. PATENT DOCUMENTS

| | | | |
|---|---|---|---|
| 8,385,469 B2 | 2/2013 | Wang et al. | |
| 8,570,101 B2 * | 10/2013 | Apostolidou | ......... H03F 1/0294 330/10 |
| 2015/0155893 A1 | 6/2015 | Winoto | |

FOREIGN PATENT DOCUMENTS

| | | |
|---|---|---|
| WO | 2018132006 A1 | 7/2018 |
| WO | 2020060543 A1 | 3/2020 |

OTHER PUBLICATIONS

Alavi et al. "A Wideband 2x 13-bit All-Digital I/Q RF-DAC", IEEE Transactions on Microwave Theory and Techniques, Plenum, USA, vol. 62, No. 4, Apr. 1, 2014 (Apr. 1, 2014), pp. 732-752, XP011544292, ISSN: 0018-9480, DOI: 10.1109/TMTT.2014.2307876.

* cited by examiner

*Primary Examiner* — Betsy Deppe
(74) *Attorney, Agent, or Firm* — Ipsilon USA—NLO

(57)      ABSTRACT

Provided herein is a digitally controlled segmented RF power transmitter with a digital processing part and an RF power amplification part having a plurality of segments. The digital processing part has a clock generation block arranged to generate n equi-phased clock signals with a 50% duty-cycle ($f_{LO,x\_50\%}$, $C_x$), and a sign-bit phase mapper unit arranged to receive the n equi-phased clock signals ($f_{LO,x\_50\%}$; $C_x$), and sign bits ($Sign_I$, $Sign_Q$), and to output a set of m, m≤n, phase mapped clock signals with a 50% duty-cycle ($CLK_{y,50\%}$; $C_y$) using a predetermined phase
(Continued)

swapping scheme. Each of the plurality of segments includes logic circuitry receiving the set of m phase-mapped clock signals with a 50% duty-cycle ($CLK_{y,50\%}$; $C_y$), and arranged to provide the respective segment driving signal with a duty-cycle z of less than 50%.

15 Claims, 13 Drawing Sheets

(58) Field of Classification Search
CPC ..... H03F 3/00; H03F 3/20; H03F 3/24; H03F 3/26; H03F 3/30; H03F 1/00; H03F 1/32; H03F 1/02; H03F 1/0277
See application file for complete search history.

-- Prior Art --

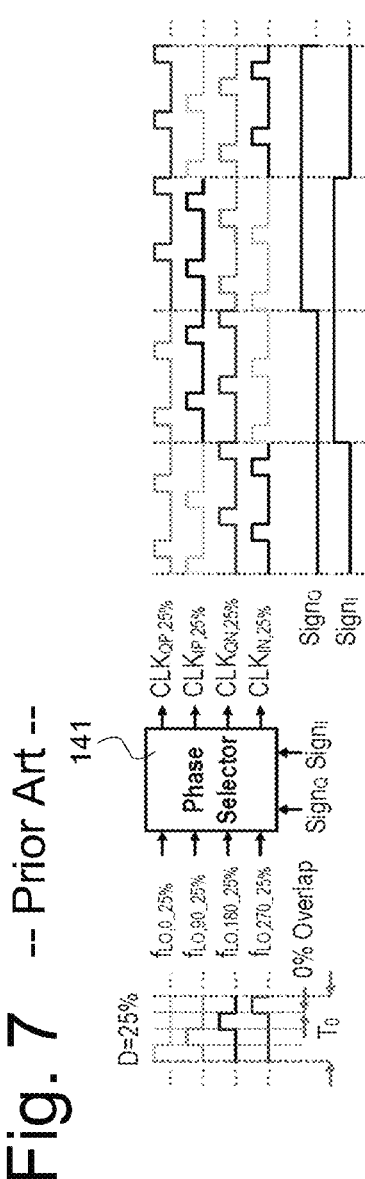
Fig. 7 -- Prior Art --
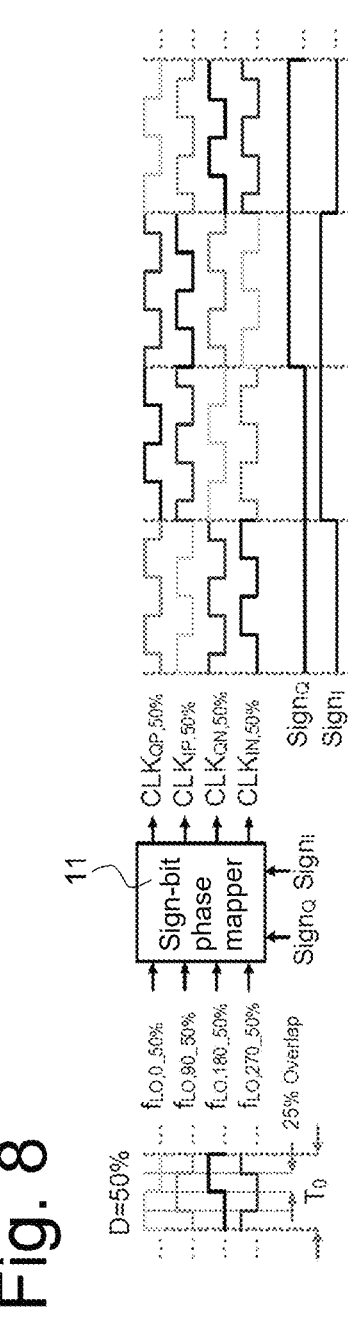
Fig. 8

Fig. 12A
-- Prior Art --
Fig. 12B
-- Prior Art --
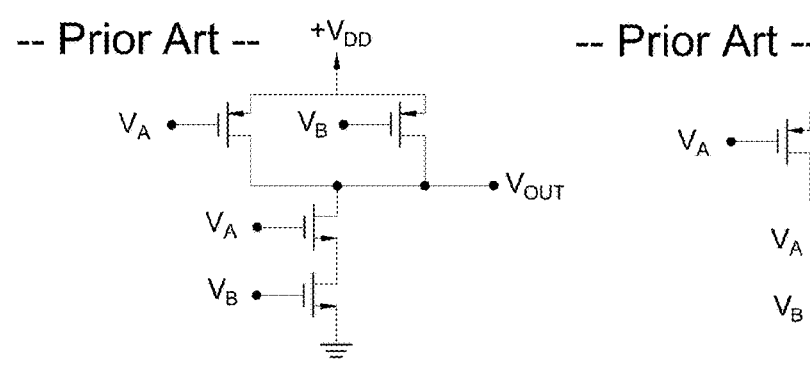
Fig. 13A
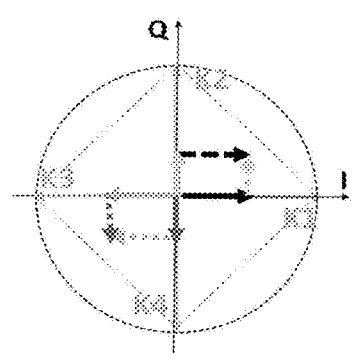
Fig. 13B
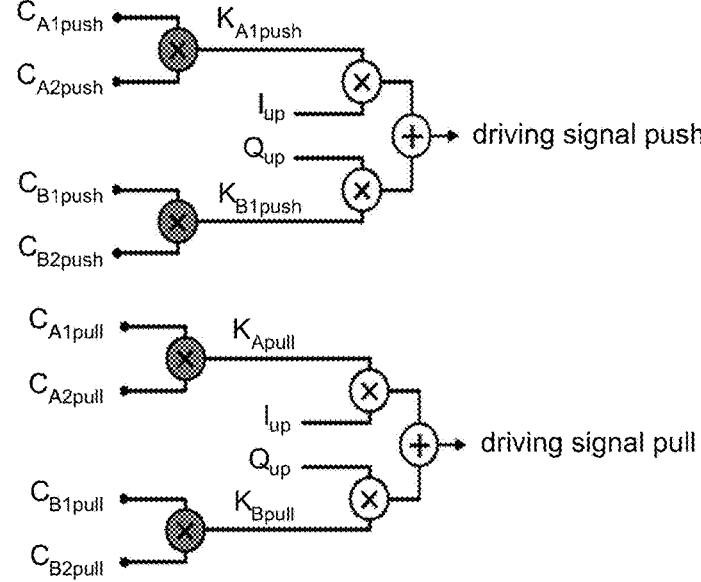

Fig. 14

DIGITAL TRANSMITTER FEATURING A 50%-LO SIGNED PHASE MAPPER

FIELD OF THE INVENTION

The present invention relates to a digitally controlled segmented RF power transmitter comprising a digital processing part and an RF power amplification part connected to the digital processing part, the RF power amplification part comprising a plurality of segments, each segment having an associated activation area, the segments being controlled by an activation scheme for activating specific ones of the segments with a segment driving signal depending on a code word received from the digital processing part.

BACKGROUND ART

Transmitters for wired and wireless systems are traditionally analogue in nature for their RF frontend 105, as shown in the generic block diagram of FIG. 1. Such transmitters comprise a digital input processing part 101 to convert the digital baseband information, which is typically represented by a stream of in-phase ($I_{BB}$) and quadrature ($Q_{BB}$) digital code words output from an I/Q baseband processing unit 102, directly to the analogue domain by using base-band digital-to-analogue converters DACs 103, controlled by clock 104. The transmitter further comprises an RF front-end 105, that processes the analog signals output by the DACs 103 using low-pass filters 108 to remove the sampling replicas. Next quadrature frequency up-conversion takes place, using an analogue quadrature mixer configuration, providing the amplitude and phase modulated RF signal ($RF_{mod}$). The analogue quadrature mixer configuration comprises a local oscillator 107, phase shifter 106, multipliers 109 and adder 110. This signal is amplified by a chain of amplifying stages (driver 111) and a power amplifier 112, to bring the RF out signal 7 at the desired level before it is transmitted by an antenna.

To meet EVM and spectral requirements of wireless standards (e.g. 3GPP), all electronic functions need to behave linearly and should not yield any distortion of the transmitted RF signal 7. Furthermore the wireless transmitter also needs to be energy efficient. In analogue design these are typically conflicting requirements, yielding many compromises in the design of a wireless transmitter. Furthermore, the RF frontend 105 is typically realized making use of different semiconductor device technologies. E.g. CMOS for the digital baseband parts, RF CMOS, SOI, or SiGe for the low power analogue parts of the RF frontend 105, while GaAs, LDMOS or GaN technologies are frequently used to implement the power amplifier 112 (when aiming transmitter power larger than 1 W). This yields low integration, high cost, and logistic problems. The inaccuracies that are always present in analogue circuits are the cause for LO leakage, poor image rejection, and as such demand complicated IQ calibration. Furthermore the analogue nature of the RF frontend 105, requires the use of (high) quiescent currents to achieve sufficient linearity. This results in significant power consumption in low traffic scenarios, or even in "off" mode operation. Typically the power amplifier 112 makes use of efficiency enhancement techniques, such as supply voltage modulation or Doherty operation to improve its efficiency in power back-off operation (PBO). However, also here the analogue nature of the circuits yields to imperfections and/or inaccuracies, which limits in practical situations both the achievable peak efficiency, as well as the efficiency in power back-off.

Recently Direct Digital to RF signal up-conversion techniques have been introduced to circumvent the problems and restrictions related to analogue transmitter implementations. These techniques are also referred to as RFDACs, or RF mixing DACs. When covering the complete digital transmitter (including the output power stage(s)) they are referred to as Digital (intensive) transmitter (DTX) or can also be referred to as a direct-digital RF modulator (DDRM).

Prior art digital transmitter (DTX) implementations so far have been almost exclusively restricted to a few watts RF output power. This allowed them to use very compact sizes for switch banks in their output stages (power amplifier 112). As such, these implementations can be considered electrically small in view of their operating frequency and suffer only to a limited extent from current redistribution effects that yield irregularities in their digital baseband (e.g. due to codewords CWDs) to their RF output signal transfer. For this reason, prior-art DTX implementations are not so sensitive to their actual switch bank layout implementation and related TX unit cell activation. This drastically changes when aiming for higher power levels (i.e. more than 10 W). In such a high power implementation the realized switch banks are no longer electrically small compared to their operating frequency. Therefore, RF output current distribution effects occur due to the digitally controlled activation of its TX unit cells, severely degrading the quality of the CWD-to-RF output transfer (i.e. CWD-AM and CWD-PM transfer). These irregularities and disruptive behaviour in this transfer are very difficult to correct for by means of signal processing and/or a DPD arrangement. Therefore significantly limiting the achievable "noise floor" and spectral purity of the output signal of current generation of power DTX implementations.

International patent publication WO2018/132006 discloses a digitally-controlled power amplifier (DPA) which includes a radio frequency digital-to-analog converter (RF-DAC) constructed from nonlinearly weighted PA segments, a multiphase RF drive signal generator that drives the PA segments, and overdrive voltage control circuitry. The overdrive voltage control circuitry is used to fine tune the RF output of the DPA and compensate for other non-idealities and external influences such as process, voltage, temperature (PVT), frequency and/or load impedance variations.

US patent publication US2015/155893 discloses a device including: modulation circuitry of a radio frequency transmitter having a local oscillator frequency; a digital power amplifier coupled with the modulation circuitry; and a clock input coupled with the digital power amplifier; wherein the clock input provides a clock signal to the digital amplifier at a sampling clock frequency; and wherein the local oscillator frequency is an integer multiple of the sampling clock frequency.

International patent publication WO2020/060543 discloses a digital transmitter architecture to transmit (TX) multi-gigabit per second data signals on single carriers (SC) or orthogonal frequency division multiplexing (OFDM) carriers at millimeter wave frequencies in either one of a high-resolution modulation mode or a spectral shaping mode. The architecture includes a number of digital power amplifiers (DPA) and modulation reconfigurable circuit segments to process individual bits of a data bit stream in parallel according to a specific circuit configuration corresponding to the selected TX mode using a multiplexer to switch between configurations. US patent publication U.S. Pat. No. 8,385,469 discloses a low cost high-efficiency all-digital transmitter using all digital power amplifiers ("DPA") and various mapping techniques to generate an output signal, which substantially reproduces a baseband signal at a carrier frequency. A DPA control mapper outputs control signals to phase selectors using the quantized signal and a quantization table. Each phase selector receives one of the control signals and outputs a waveform at a carrier frequency with a phase corresponding to the control signals, or an inactive signal.

SUMMARY OF THE INVENTION

The present invention seeks to provide implementations of a digital intensive transmitter DTX with an increased efficiency in circuit design and a reduced power consumption, while offering an enhanced spectral purity.

According to the present invention, a digitally controlled segmented RF power transmitter as defined above is provided, in which the digital processing part comprises a clock generation block being arranged to generate n equi-phased clock signals with a 50% duty-cycle, x being a phase indicator, n being an integer value equal to or larger than 4, and a sign-bit phase mapper unit being arranged to receive the n equi-phased clock signals with 50% duty-cycle, and sign signals, and to output a set of m, m≤n, phase mapped clock signals with a 50% duty-cycle, y being a phase swap indicator, using a predetermined phase swapping scheme, wherein each of the plurality of segments comprises logic circuitry receiving the set of m phase-mapped clock signals with a 50% duty-cycle, the logic circuitry being arranged to provide the respective segment driving signal with a duty-cycle z of less than 50%.

In summary, the present invention embodiments is having a sign-bit controlled phase mapper, that operates on n equi-phased 50% duty-cycle clocks, and provides m phase mapped 50% duty-cycle clocks that are distributed globally using a clock tree, facilitating straightforward local generation of the low-duty-cycle (below 50%) upconverting clock signals at or in the unit cells/segments. These upconverting clocks are used together with the up-sampled baseband information to provide the drive signals for the DTX segments. Using this method based on the 50%-LO clock tree distribution with correct sign-bit operation, strongly lowers the impact of clock line coupling and other clock tree parasitics and as such is more immune to duty-cycle distortion, while providing more robust LO signal handling in the clock trees, with less power consumption, resulting in a more linear CWD to RF output signal transfer yielding an output spectrum with high spectral purity.

SHORT DESCRIPTION OF DRAWINGS

The present invention will be discussed in more detail below, with reference to the attached drawings, in which FIG. 1 shows a block diagram of a prior art generic transmitter having an analogue RF frontend;

FIG. 2 shows a schematic diagram of a generalized polar digital intensive transmitter (polar DTX);

FIG. 3 a) to e) show DTX signal representations for polar, unsigned Cartesian, signed Cartesian, constellation mapped (interleaved) signed Cartesian and multi-phase/poly-phase implementations;

FIG. 7 shows a prior art phase selector operation implementation using a 25% duty-cycle LO clock signals and resulting 25% duty-cycle quadrature clock signals;

FIG. 8 shows a sign-bit phase mapper unit as applied in a digital transceiver according to an embodiment of the present invention, providing 50% duty-cycle clock signals;

Figures 9A, 9B, 9C:
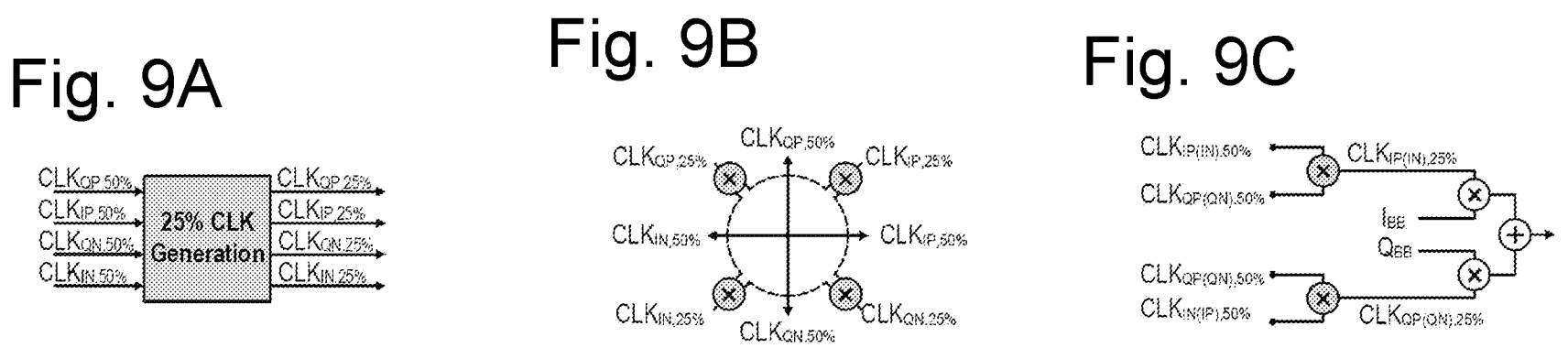
Figure 10:
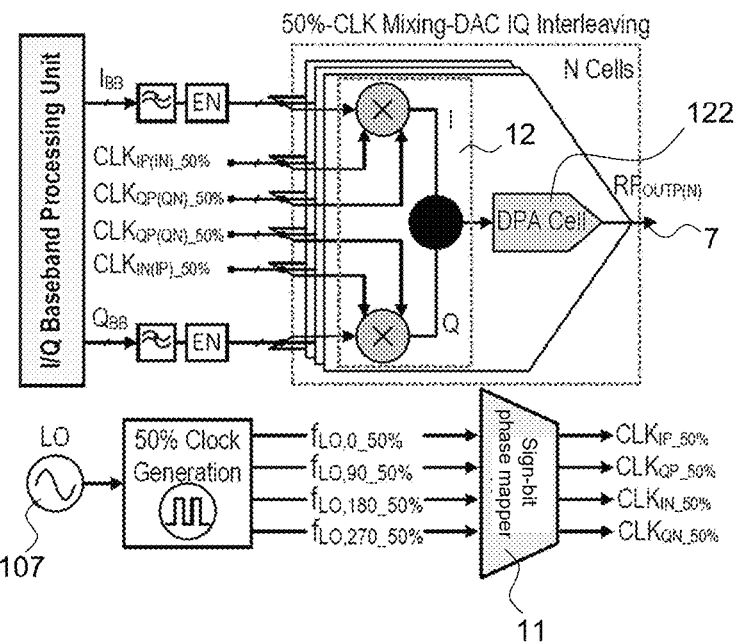
Figure 11:
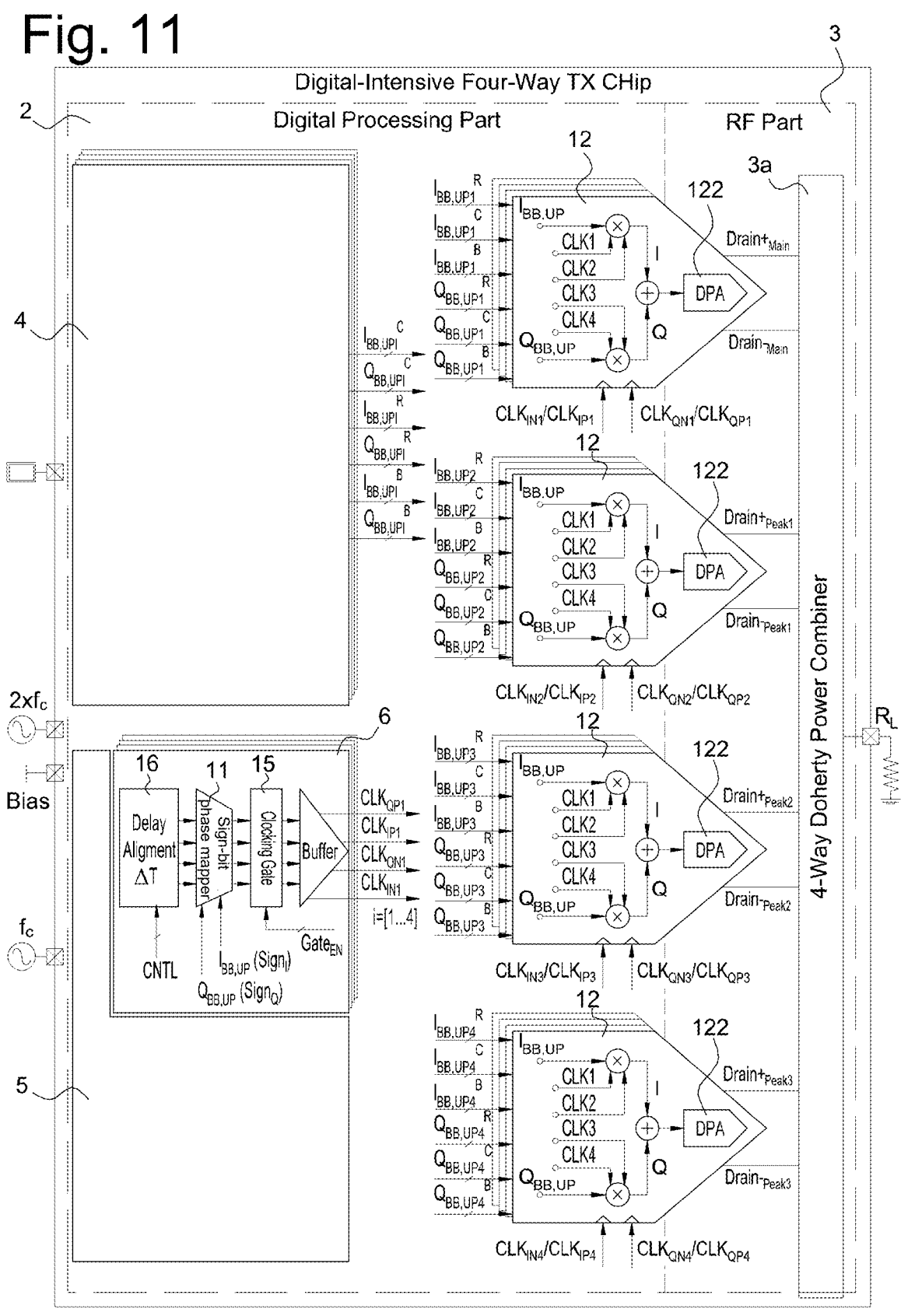
Figure 15:
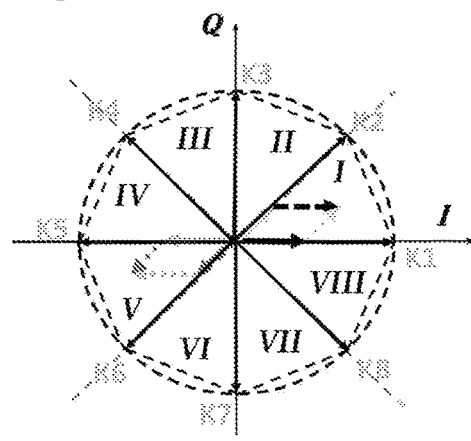
Figure 16A:
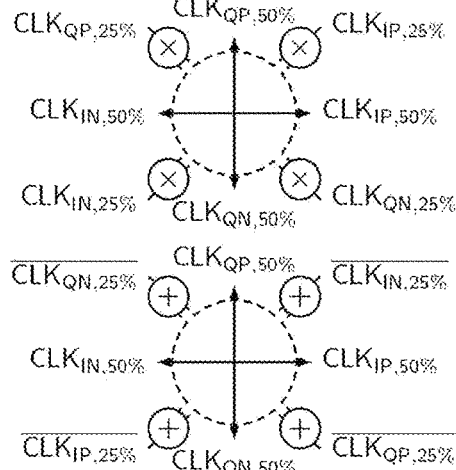

FIG. 9A-C show a local logic circuitry applied near or in a unit cell in a digital transceiver according to an embodiment of the present invention, and schematic diagrams providing 25% duty-cycle clock signals for activating a unit cell;

FIG. 10 shows a Cartesian DTX implementation with a sign-bit phase mapper unit 11 operating on 50% duty-cycle clocks in accordance with a further embodiment of the present invention;

FIG. 11 shows a block diagram of an exemplary embodiment of a digital intensive four-way transmitter chip implementing a sign-bit phase mapper unit 11;

FIG. 12A shows a circuit diagram of a conventional NAND-gate, and FIG. 12B shows a circuit diagram of a symmetric NAND-gate as applied in embodiments of the present invention;

FIG. 13 shows a schematic of an implementation of logic circuitry as applied in an embodiment of the present invention;

Figure 14:
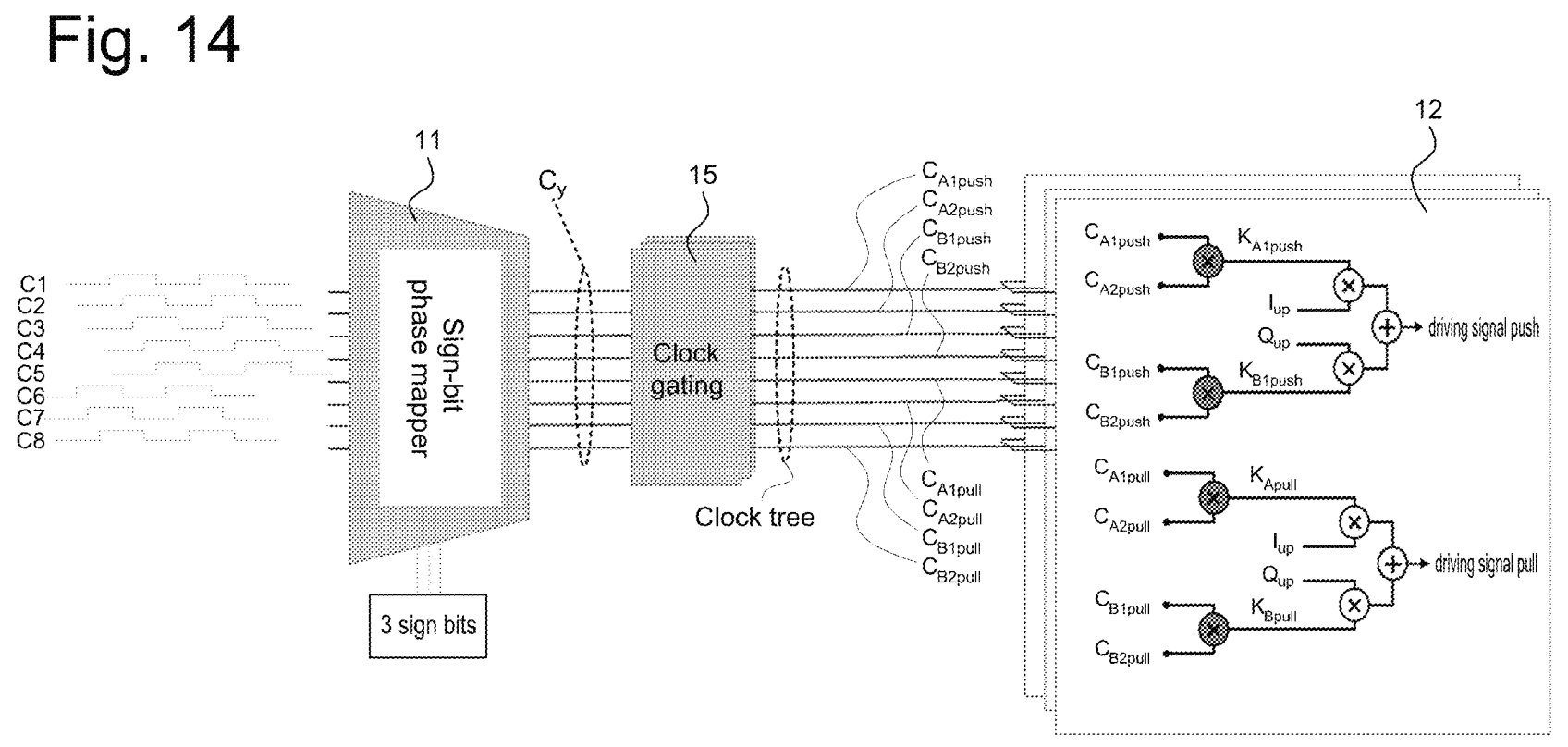

FIG. 14 shows a schematic diagram of an eight-phase implementation of a DTX in accordance with a further embodiment of the present invention;

FIG. 15 shows an IQ constellation diagram for the eight-phase implementation shown in FIG. 14; and FIGS. 16A and B show logic circuitry and schematic diagrams of alternative embodiments for providing low duty-cycle clock signals for activating a unit cell using complementary signals.

DESCRIPTION OF EMBODIMENTS

Digital intensive transmitters (or digital transmitters, DTX) are considered as candidate building blocks to implement new applications such as mMIMO 5G networks in a cost effective and energy efficient manner. Examples of such digital intensive power transmitters are described in patent application NL-A-2024903 of the same applicant, which is not yet published, and incorporated herein by reference.

The present invention embodiments, as described herein with reference to a number of exemplary embodiments, aim for an optimum (interference, error and noise free) generation of the low-duty-cycle signals needed to drive the plurality of unit-cells/gate segments in a digital intensive transmitter. This technique is based on the use of a dedicated sign-bit controlled clock phase mapper that works exclusively with 50% duty-cycle clock signals for distribution of the clock signals over the clock tree of the switch bank(s) of a digital transmitter. By using dedicated phase mapping schemes for this phase mapper, local generation (at or near the unit cells) of the low duty-cycle driving signals with proper phases for selecting the correct quadrant/segment and desired duty-cycle can be achieved with relatively simple (symmetric) logic gates. The benefits of the proposed technique are: lower impact of clock line coupling and parasitics; more immunity to duty-cycle distortion; more robust LO signal handling in clock trees; less power consumption clock tree; and more linear/high quality output spectrum.

Figure 1:
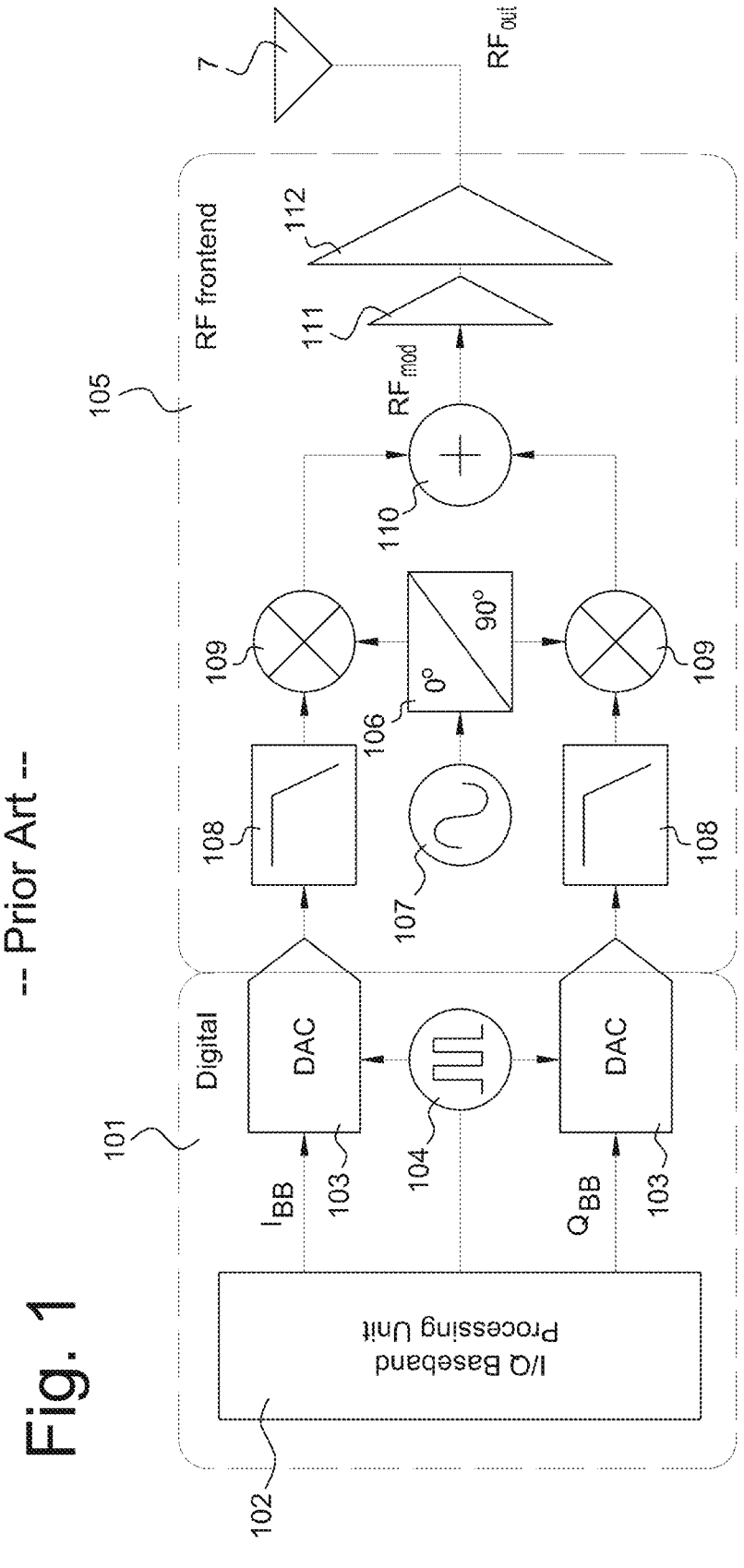
Figure 2:
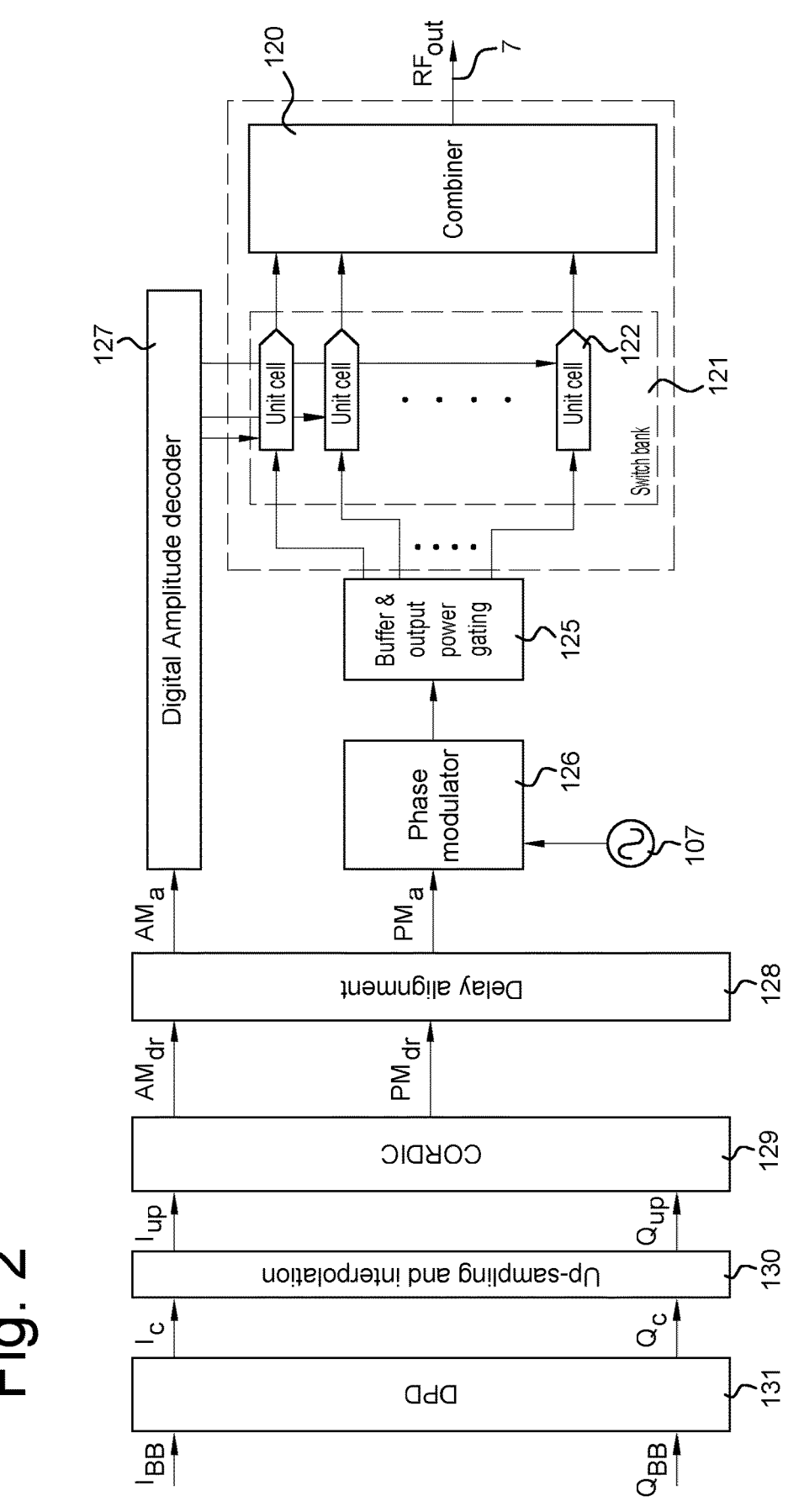

FIG. 2 shows a schematic diagram of a generalized polar digital intensive transmitter (polar DTX). In such a polar DTX architecture, depending on their exact nature (raw IQ data or already somewhat filtered and -resampled) the original $I_{BB}$ and $Q_{BB}$ data can be partly resampled and interpolated prior to pre-distortion by the DPD unit 131, after which the resulting $I_c$ and $Q_c$ data is further up-sampled and low-pass filtered (the combination of up-sampling and filtering is also called interpolation/resampling) in an up-sampling and interpolation unit 130. Note that this sequence is often dictated by the computational speed constraints of the DPD unit. Next a CORDIC unit 129 takes the up-sampled $I_{up}$ and $Q_{up}$ data and transfers it from the Cartesian-to-polar signal representation. The resulting amplitude (AM or envelope ($\rho$) and phase (PM or $\varphi$) digital signal representations are adjusted in their time alignment using delay alignment unit 128, in order to compensate for delay differences in the AM and PM signal paths, prior to recombining them in an output "switch" bank 121. The resulting $AM_a$ signal is fed to digital amplitude decoder 127, which controls the number of activated output unit cells 122 in the switch bank 121. The output signals of the digitally controlled unit cells 122 are combined in the analogue domain using a power combining arrangement 120. The more unit cells 122 are activated, the higher the output current/power signal. In some architectures these corrections are done after the CORDIC. A clear disadvantage of the polar architecture is the bandwidth expansion that occurs in transferring the original Cartesian baseband I and Q data to its amplitude ($\rho$) and phase ($\varphi$) representation (see Table 1 below). This requires the use of non-linear operations for the phase and magnitude that do give rise to such a bandwidth expansion. In practice this means that the bandwidths (sampling rates) that the phase modulator 126 and amplitude decoder 127 needs to provide are typically a factor (~5×) higher than that of the original baseband signal to be represented. This expansion yields severe constraints when working with very large bandwidth signals (e.g. higher than 80 MHz). More importantly, the delay difference(s) between the envelope and phase paths restricts using a signal with large modulation bandwidth as it significantly affects the in-band linearly, as well as close-in spectral purity of the communication system. This is the reason why polar architectures are considered to be less suited for handling the latest upcoming communications standards, like the fifth generation (5G) of wireless networks, that aim to use modulation bandwidths as high as 400 MHz in sub-6 GHz systems.

| Polar | Cartesian | Signed Cartesian | Constellation mapping (for interleaved Cartesian) | Multi-phase or Poly-phase (8-phases case) |
|---|---|---|---|---|
| $\rho = \sqrt{I^2+Q^2}$ $\varphi = \tan^{-1}\left(\dfrac{Q}{I}\right)$ | $I + jQ$ | Vector amplitudes: $\lvert I\rvert$ $\lvert Q\rvert$ Phase selection: sgn(I) sgn(Q) | $I' = I + Q$ $Q' = I - Q$ | $A = \lvert\lvert I\rvert - \lvert Q\rvert\rvert$ $B = \sqrt{2}\,\min(\lvert I\rvert, \lvert Q\rvert)$ | of the signal $RF_{out}$ 7. The $PM_a$ signal digitally controls a phase modulator unit 126, which adjusts a local oscillator signal from local oscillator 107 for its phase. The resulting phase modulated signal is fed to a buffer 125 that provides a "digital" phase modulated clock, which is used to drive the unit cells 122 in the output stage(s). The amplitude and phase information is (re)combined in the output stage, such that the amplitude, as well as, phase modulated output signal ($RF_{out}$) is constructed. Gating of the clock signal can be applied to save clock tree power in PBO conditions when not all unit cells 122 are activated. It is important for achieving a good output signal quality, that the resulting RF signal of the switch bank 121 is monotonic in nature and free of glitches or other disturbances such that it exhibits a smooth behavior. However, achieving this smooth behavior is often a challenge in practical implementations. The power combining arrangement 120, in combination with the output impedance that it will offer to the unit cells 122, and the control of the unit cells 122, will set the operation class of the output stage. Multiple of these switch banks 121 can be used in an efficiency enhancement concept like Doherty, provided that the proper phase and drive conditions for these switch banks 121 in relation to the nature of the Doherty output power combiner are used.

Polar transmitters offer advantages in terms of their efficiency and output stage power utilization, and they are relatively easy to correct for their imperfections due to their rather independent amplitude and phase behavior. This allows in many practical situations the use of a 2×1 dimensional DPD correction scheme (AM-AM and AM-PM) in DPD unit 131. Note that in the architecture shown, this "polar" correction is done using the IQ representation of the FIG. 3 $a$) to $e$) show DTX signal representations for polar, unsigned Cartesian, signed Cartesian, constellation mapped Cartesian and multi-phase implementations, which will be referred to in the description below. For the multi-phase implementation, the following table is an example for 8 phases:

| Octant | Logic expression | $\theta_A$ | $\theta_B$ |
|---|---|---|---|
| I | $(I \geq 0)\wedge(Q \geq 0)\wedge(\lvert I\rvert \geq \lvert Q\rvert)$ | 0 | $\pi/4$ |
| II | $(I \geq 0)\wedge(Q \geq 0)\wedge(\lvert I\rvert < \lvert Q\rvert)$ | $\pi/2$ | $\pi/4$ |
| III | $(I < 0)\wedge(Q \geq 0)\wedge(\lvert I\rvert < \lvert Q\rvert)$ | $\pi/2$ | $3\pi/4$ |
| IV | $(I < 0)\wedge(Q \geq 0)\wedge(\lvert I\rvert \geq \lvert Q\rvert)$ | $\pi$ | $3\pi/4$ |
| V | $(I < 0)\wedge(Q < 0)\wedge(\lvert I\rvert \geq \lvert Q\rvert)$ | $\pi$ | $-3\pi/4$ |
| VI | $(I < 0)\wedge(Q < 0)\wedge(\lvert I\rvert < \lvert Q\rvert)$ | $-\pi/2$ | $-3\pi/4$ |
| VII | $(I \geq 0)\wedge(Q < 0)\wedge(\lvert I\rvert < \lvert Q\rvert)$ | $-\pi/2\pi$ | $-\pi/4$ |
| VIII | $(I \geq 0)\wedge(Q < 0)\wedge(\lvert I\rvert \geq \lvert Q\rvert)$ | 0 | $-\pi/4$ |

Figure 4:
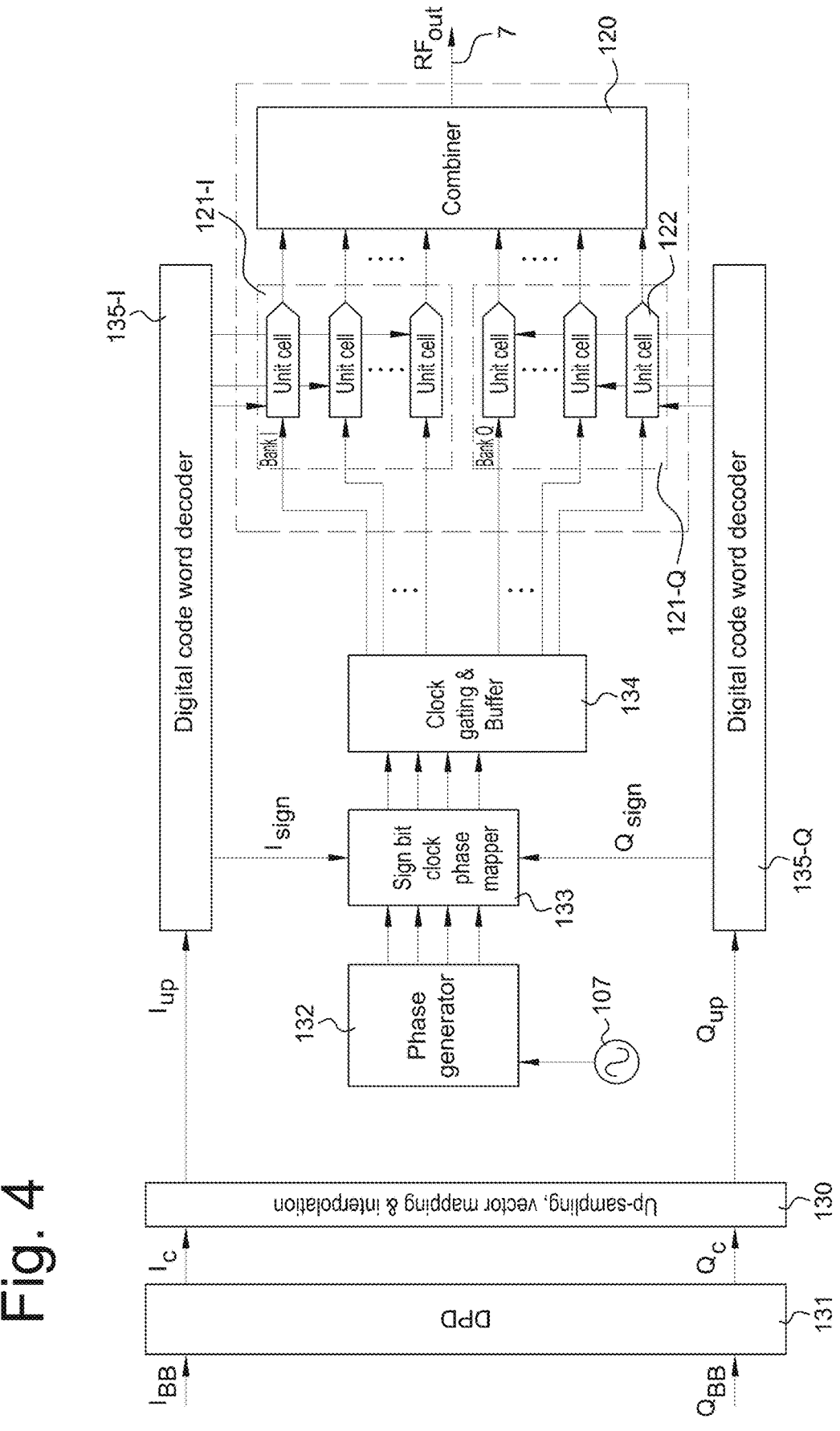
FIG. 4 shows a block diagram of a Cartesian digital intensive transmitter (Cartesian DTX)

FIG. 4 shows a block diagram of a Cartesian digital intensive transmitter (Cartesian DTX). To overcome the bandwidth constraints of the polar DTX architecture, the Cartesian DTX architecture is recently attracting more attention when targeting wideband applications (e.g. modulation bandwidth >80 MHz).

Cartesian (I/Q) [Alavi, MTT 2012] and multi-phase DTX are typically considered to be superior over their polar counterparts in terms of bandwidth, since they are based on linear (vector) summing rather than the use of non-linear equations, which (to some extent) avoids bandwidth expansion as found in polar systems. Closer inspection shows that this is definitely true for unsigned Cartesian operation. However, for signed Cartesian and multi-phase operation, switching between clock phases is used to select the proper quadrant/sector (i.e., the signed I/Q TX requires clock phase modulation). This switching between clock phases, can also be considered as wideband phase modulation, that also introduces bandwidth expansion, however, in stark contrast with polar this is done in a synchronized clocked regime, which allows a much more simple implementation of the related phase mapper (very low-resolution phase modulator, implemented using clock selection) than in the polar case, which needs a continuous changing phase. First the Cartesian concept will be explained, which is later generalized to the multi-phase concept. Multi-phase operation was first reported in [Matsuura, 2011] and [Wang, 2010]

In a Cartesian DTX (see FIG. 4), the $I_{BB}$ and $Q_{BB}$ data can be pre-distorted by a DPD unit 131, after which it is further up-sampled and interpolated in up-sampling and interpolation unit 130. The up-sampled $I_{up}$ and $Q_{up}$ are provided to digital code word decoders 135-I and 135-Q, that transfers the original (binary) code words ($I_{up}$ and $Q_{up}$) in a (thermometer) form suitable to control the activation of the unit cells 122 in the I switch bank 121-I and Q switch bank 121-Q. Note that using thermometer coding, glitches and mismatch in the electrical performance of the unit cells 122 can be reduced. To achieve higher efficiency, signed Cartesian operation is typically used. In contrast to unsigned I/Q operation, which avoids clock phase switching (see FIG. 3 b) and c)), in signed Cartesian operation, when the intended output signal is zero, no unit cells 122 will be activated. As such signed Cartesian operation shows an efficiency behavior that is similar with class-B, this in contrast to unsigned Cartesian operation, which has an efficiency behavior or similar to class-A operation.

In the signed I/Q DTX configuration, the local oscillator signal from local oscillator 107 is converted by the phase generator 132 in four clock signals that have (constant) 90 degree phase shifts relative to each other ([Alavi, ASSCC 2011]). As such these clocks are equally distributed over 360 degrees, or in other words, equally distributed over the RF period of the TX carrier frequency. These (phase shifted) clocks are needed to be addressed, using a sign-bit clock phase mapper 133, the 4 quadrants. This quadrant selection is controlled by the I and Q sign-bits ($I_{sign}$ & $Q_{sign}$). The resulting phase swapped clocks from the sign-bit clock phase mapper 133 provide the desired activation moment in the RF cycle for the unit cells 122 in the switch banks 121-I and 121-Q, via the clock gating and buffer unit 134.

Different than for a polar system, in which the CORDIC controlled phase modulator 126 provides a "continuous" (gradual) changing phase, Signed Cartesian operation is characterized by switching at synchronized times between the four (constant phase) clock signals. Another advantage is that the I and Q signal paths are identical in hardware nature, as such timing misalignment between them is small compared-to-polar DTX. This, combined with its synchronized nature, allows retiming of the clock tree signals, as well retiming of the (up-sampled) baseband information. This allows to reduce the impact of delay mismatches and other timing inaccuracies in practical implementations.

Nevertheless, I/Q and multi-phase DTXs (see Table 1 and FIG. 3) suffer from (signal) interaction between the activated unit cells in their switch banks. This is mostly caused by the simultaneous use of different clock phases (both "on") in the activation of their PA unit cells 122 within one RF cycle. This interaction is typically most severe at higher power levels, where the large number of activated unit cells 122 in the switch banks 121 cause a drop in the effective output impedance of the switch bank 121. This yields to the situation that the switch bank's electrical behavior starts to deviate from that of a current source, making it susceptible to interactions between the cells 122 activated by the different phases. This gives rise to poor I/Q image rejection and other sources of signal distortion.

Use of non-overlapping clocks in DTX switch bank operation in Cartesian [Alavi MTT 2014] and multi-phase transmitters, can significantly lower these interactions by using only one clock-phase at the time in the activation of the PA cells 122. In Cartesian operation this non-overlapping condition results in a duty-cycle of 25% or less for the activation of the unit cells 122 in the switch bank(s) 121. For multi-phase operation using non-overlapping clocks, this required duty-cycle becomes even shorter (e.g. 12.5% in an eight-phase DTX). This use of (very) short duty-cycle clocks comes with implementation challenges at higher operating frequencies (e.g. above 3 GHz). Therefore, the use of overlapping activation clocks can be still beneficial for these multi-phase DTX concepts.

Figure 5:
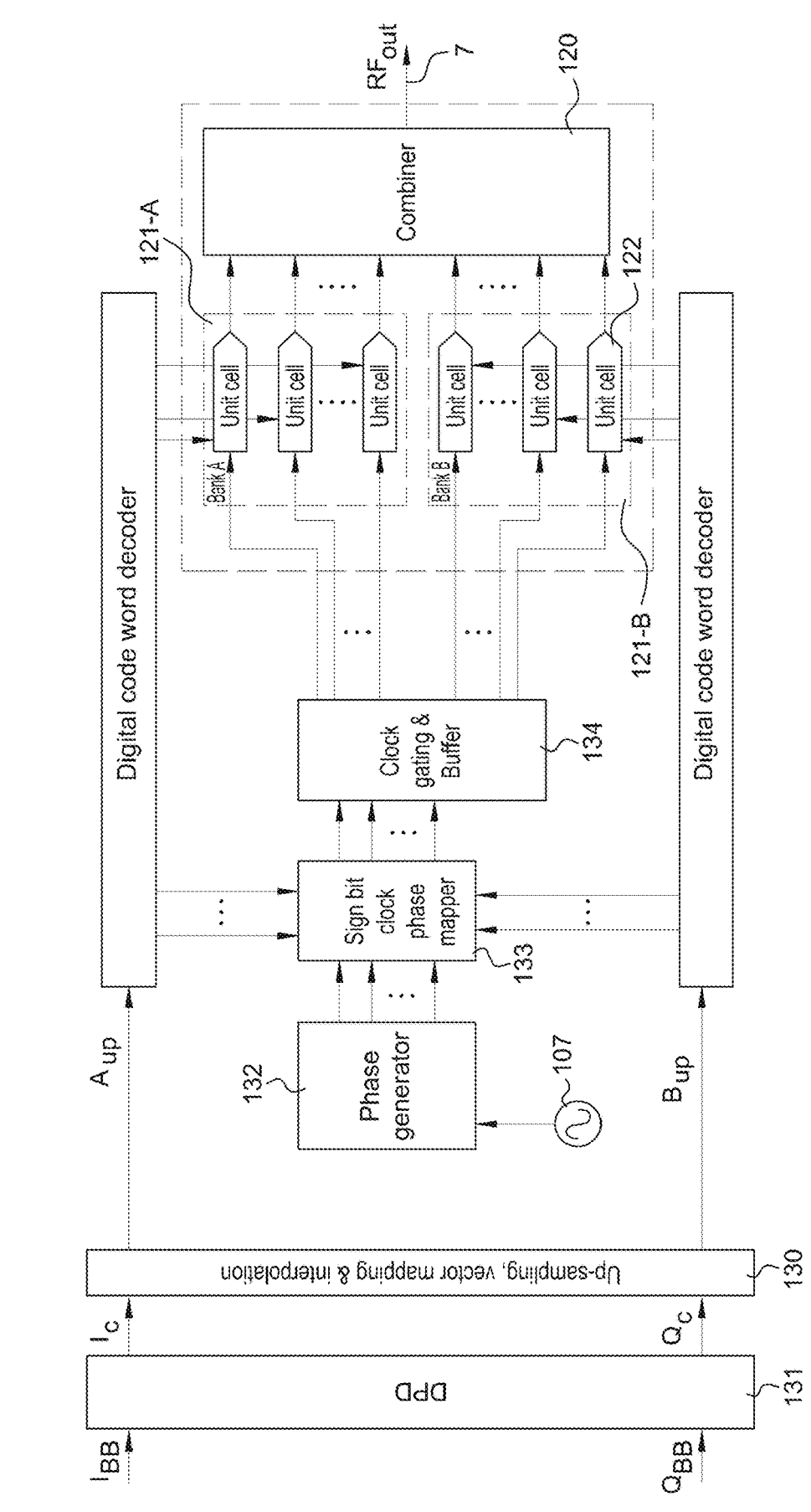
FIG. 5 shows a block diagram of a Multi-phase digital intensive transmitter (multi-phase DTX)

FIG. 5 shows a block diagram of a multi-phase digital intensive transmitter (multi-phase DTX). Multi-phase systems use more than the 4 phases in the Cartesian DTX to drive the unit cells 122 in their switch bank(s) 121. In particular the use of 8 phases seems to be a suitable number (see FIG. 3 e)). The use of more phases, (e.g. 8 phases or 16 phases) allows the use of a smaller phase angle difference between the clocks driving the switch bank(s) 121. As a consequence, the resulting analogue "vector" summation is less perpendicular (e.g. 45 degree) than in the Cartesian case (90 degree). This lower phase difference in the signal summing increases the efficiency for off-axis constellation points (compared to Cartesian DTX), and when using many phases (e.g. 16 or more) approaches the efficiency of a polar system. In addition, since the summed "vectors" are more "aligned" in their direction, less severe undesired interactions happen between the activated unit cells 122 outputs operating on different phases compared to Cartesian, yielding a more perfect summing of their generated output signals. Therefore, if the phase difference is limited (e.g. 45 degree or less) some overlap in the activation clocks that drive the unit cells 122 in the switch bank 121 can still be accepted. Consequently, in practical multi-phase concepts a trade-off can be found between lower interaction (higher linearity & efficiency) and output power. This can also be balanced between technology constraints in switching speed and output power. However, in both Cartesian and multi-phase DTX implementations the duty-cycle used in clocking the unit cells is best kept well below 50%. In particular the use of a 25% clock duty-cycle is considered as a good compromise in terms of efficiency and output power capability. It can be shown that 33% duty-cycle also offers specific advantages, in terms that a low $3^{rd}$ harmonic content output is provided.

As to the switch bank 121 and unit cell 122 organization and activation in polar DTX, the following observations can be made. In a single-ended polar DTX all the unit cells 122 share the same phase modulated "digital" clock for controlling their activation moment and duration of this activation. This duration is typically set by the duty-cycle of this phase modulated clock. When using class-B or class-C like operation, the use of a shorter duty-cycle is beneficial in achieving higher peak efficiency (e.g. for a square wave with a duty-cycle of 50%, the theoretical peak efficiency when all harmonics of the output stage are shorted is 63.6%, while for a duty-cycle of 25% this has increased to 90% [W. Gaber ESSCIRC 2011 and W. Gaber TMTT 2017]). Since all unit cells 122 use the same clock signal, only one switch bank 121 is required as shown in FIG. 2, and the clock tree is relatively straightforward, however, practical implementations might suffer from glitches and non-monotonic behavior in their CWD-AM and CWD-PM transfer, due to the imperfections in the realized thermometer and/or binary bits (e.g. device matching and or current redistribution effects), that yields errors in both amplitude and phase of the resulting overall output signal. Note that the CWD-to-RF output (its integral nonlinearity (INL)) is preferred to be monotonic.

To improve on spectral purity of a DTX configuration, it is often considered to be beneficial to favor push-pull over single-ended operation. This is due to the inherent rejection of even harmonic products as well as suppression of substrate and noise supply in push-pull architectures. In such a configuration also the clock tree is typically implemented in a complementary or (pseudo) differential configuration. Consequently, in the push-pull polar DTX architecture typically not 1 but 2 phase modulated "digital" clocks are used for the activation of the unit cells 122. To implement the push-pull output stage, two separate switch banks 121 or one push-pull oriented switch bank 121 that are connected to a differential power combiner 120 or balun can be employed. Note that in a polar system the sum of the total output current/output power of the unit cells 122 sets also the peak output current/power capabilities of the polar DTX. Since all unit cells 122 are driven by the same phase (or in push-pull configuration by two 180 degree shifted phases), the current/power utilization of the unit cells 122 in a polar architecture is the highest of all DTX configurations. Therefore, the related (summed) output capacitance and losses of the unit cells 122 in this configuration is the lowest for a given output current/power for all DTX configurations.

To reduce the DC power needed for the clock tree and its related buffers, dynamic clock tree activation can be used. In such an approach, based on the amplitude code words that control the unit cell 122 activation, also the clock signals to these unit cells 122 can be activated or omitted [Alavi TMTT 2014]. This output power based clock tree activation (hereafter referred to as clock gating), helps to improve the overall efficiency of a DTX in output power back-off (PBO) conditions.

As to the switch bank 121 and unit cell 122 organization and activation in Cartesian and multi-phase DTX, the following observations can be made. The first generation of Cartesian DTX made often use of one interdigitated, or two separated push-pull switch banks 121 (FIG. 4). In these designs the unit cells 122 of these banks 121 are always performing an "I"/"Ī" operation or a "Q"/"Q̄") operation, and cannot dynamically change to another clock phase [Morteza, 2014]. In such a configuration, when operating on the I or Q axis (see FIG. 3 c)), e.g. let's assume maximum operation along the "I axis", all "I"/"Ī" cells are "on", while all "Q"/"Q̄") cells are "off". Consequently, when comparing the Cartesian DTX using separated I and Q cells 122, with the polar DTX case, twice the amount of unit cells 122 are needed to provide the same peak output capability along the I and Q axes (assuming that the unit cells in both DTX concepts are equal in terms of output current/power). For a Cartesian DTX using this concept, this yields twice the output capacitance and output losses, raising efficiency and bandwidth restrictions for practical implementations compared to a similar Polar architecture.

In a multi-phase DTX using also separate sets of unit-cells 122 to operate on the active phases (A and B), yields comparable considerations as for Cartesian DTX above.

Figure 6:
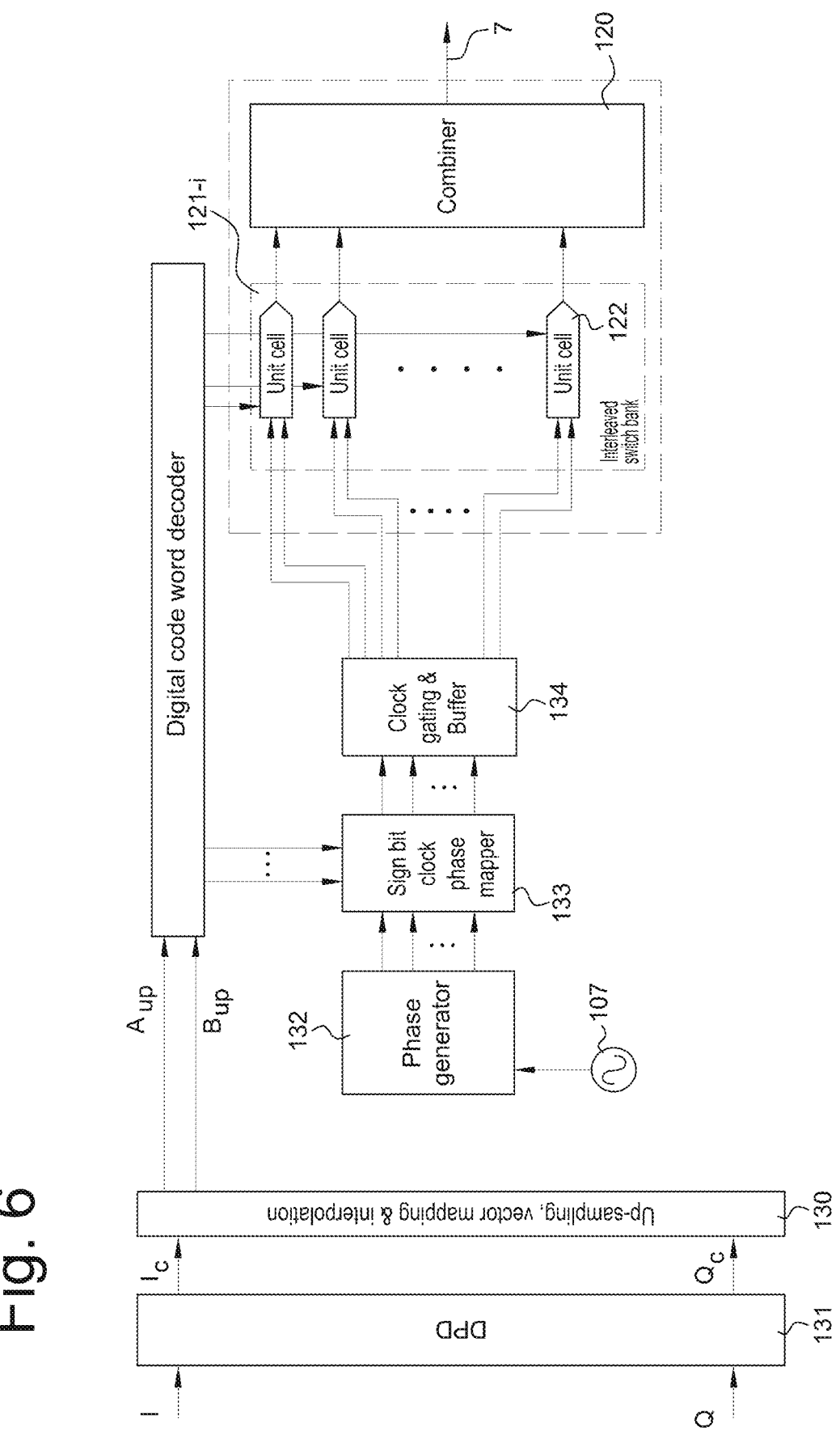
FIG. 6 shows a block diagram of an interleaved (generalized multi-phase) digital intensive transmitter (interleaved DTX)

To overcome the disadvantage of the poor output stage current/power utilization in the Cartesian and multi-phase approach featuring two separate switch banks 121, (Interleaved switch bank 121-i) operation was introduced [Jin ISSCC 2015, Mehrpoo RFIC2017]. FIG. 6 shows a block diagram of an interleaved (generalized multi-phase) digital intensive transmitter (interleaved DTX), wherein components/units with a similar function as in the FIG. 5 block diagram have the same reference numerals.

In an interleaved configuration only one (push-pull) switch bank 121-i is used, in which its unit cells 122 can be activated by "any" of the offered clock phases in order to represent an I, Q, (Cartesian) signal, a I',Q' (mapped Cartesian) or to represent an A or B signal (multi-phase). This allows all the unit cells 122 to be used for I or Q (or, similarly for I' or Q', or for A or B) if desired. Such a configuration can better approximate the polar case in terms of efficiency or output power, when the maximum power out conditions of the constellation diagram are arranged such that they occur along the I and Q axes or the phases used for driving the A and B banks.

Figure 3:
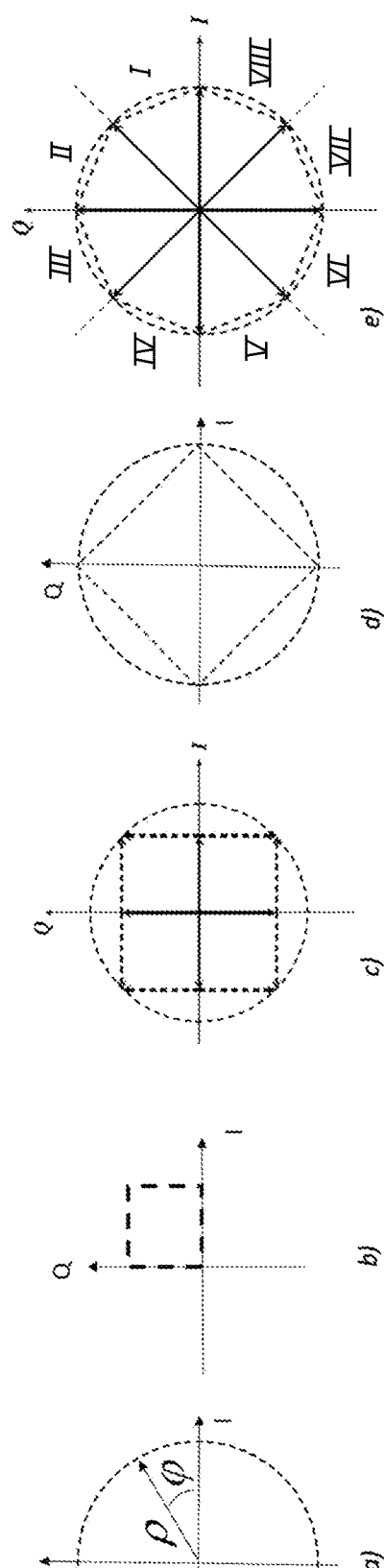

In Cartesian operation this can be achieved by using a constellation mapping (see Table 1 and FIG. 3 d)). E.g. by using a mapped representation for I and Q, namely I'=I+Q and Q'=−I effectively a 45 degree rotation of the original IQ diagram is achieved [Shen, RFIC 2020]. This mapping has the advantage that for the largest amplitude (the outer corners of the constellation diagram) all unit cells 122 are activated by either only the I' clock or Q' clock. This allows a factor $\sqrt{2}$ reduction of the required output stage current (or number unit cells) to reach the same peak output power level in comparison with a comparable "conventional" Cartesian DTX configuration. Furthermore, also the IQ interaction has been somewhat reduced, due to the fact that for the highest output powers the unit cells 122 share the same driving phase. Note that also multi-phase DTX concepts using interleaved operation for their unit cells 122 benefits from comparable considerations, although here there is no need to rotate the original IQ constellation diagram. Namely, also they show the highest output current/power along their activation axes (FIG. 3). Note, that both Cartesian and multi-phase DTX implementations are still worse than polar, when using condition that are close to |I|=|Q| or |A|=|B|, due to phase difference between the related clocking signals, as well as, the resulting overall increased effective duty-cycle of the combined output signals, which lowers the efficiency. The output losses and output capacitances of the switch bank 121 for an interleaved Cartesian implementation, compared to a traditional Cartesian implementation using separate I and Q banks are however reduced by a factor $\sqrt{2}$ and as such closer to that of polar DTX solution implemented in the same technology.

Interleaved switch bank 121/unit cell 122 operation is in literature often implicitly associated with the use of non-overlapping activation clocks [Wentzloff, 2019]. As stated before, non-overlapping clocks are expected to provide lower IQ interaction between the activated unit cells 122, when implemented correctly. For a Cartesian system, this would require the use of 25% duty-cycle clocks to obtain the activation signals for the unit cells 122. When considering multi-phase systems even smaller clock duty-cycles need to be used, to guarantee non-overlapping conditions in the activation of the unit cells 122. Namely, a 12.5% duty-cycle (or less) is needed when using 8 phases. However, using such a low duty-cycle (although beneficial for the theoretical efficiency), also limits the output power capabilities of the interleaved bank (a factor ~2.5 lower compared to 50% square wave duty-cycle operation). In addition, the clock tree and cell activation using short duty-cycle operation becomes increasingly more challenging at higher operating frequencies (e.g. 3 GHz).

For these reasons it might be still beneficial to use somewhat higher duty-cycle clocks in the multi-phase DTX case (e.g. 25%). Although in this situation again overlapping clocks are present, the reduced phase angle between the activated unit cells 122 tends to lower their interactions, while the composite duty-cycle (phase angle difference+ applied duty-cycle) can be still low enough (well below 50%) to achieve good efficiency with good output power.

Note that the use of overlapping clocks is still possible within one interleaved switch bank 121. Since on the axes between the segments, all unit cells 122 will be using the same activation phase. While in the in-between situations on the outer contours of the segments the switch bank unit cells 122 are driven by one, or the other active driving phase, with their ratios gradually changing when traveling between the segment axes. A unit cell 122 is driven either on the I/A clock or the Q/B clock (Cartesian/multi-phase case). Since, when driven by multiple phases within one RF cycle the RF output contribution of a unit cell 122, would not scale perfectly, since the unit cell 122 itself still needs non-zero time to switch on or off. As such, even with non-overlapping clocks, using one unit cell 122 (for example in a constellation mapped Cartesian DTX) to first represent I', and next Q', within one RF cycle, would give a different result than having one unit cell 122 to represent I' and other unit cell 122 Q' in the same RF cycle. In summary, the available unit cells 122 in an interleaved switch bank 121-I can be allocated to the I' or Q' (constellation mapped Cartesian) or to the A or B phases (multi-phase) or can be inactive. In a push-pull implementation, a unit cell can be thought of as one push element and one pull element, with shared activation logic. Logically in the next RF cycle their clock allocation can be changed.

Furthermore, note that single-ended interleaved operation, within one RF cycle two clock phases are used. While in push-pull interleaved operation four phases are used.

REFERENCES

[Alavi RFIT 2011] Morteza S. Alavi, Robert B. Staszewski, Leo C. N. de Vreede, John R. Long, Orthogonal summing and power combining network in a 65-nm all-digital RF I/Q modulator, 2011 IEEE International Symposium on Radio-Frequency Integration Technology, year 2011

[Gaber, ESSCIRC 2011] W. Gaber, et al., "A CMOS IQ Direct digital RF modulator with embedded RF FIR-based quantization noise filter" ESSCIRC 2011, pp. 139-142.

[Alavi, ASSCC 2011] Morteza S. Alavi, Akshay Visweswaran, Robert B. Staszewski, Leo C. N de Vreede, John R. Long, Atef Akhnoukh, A 2-GHz digital I/Q modulator in 65-nm CMOS, IEEE Asian Solid-State Circuits Conference 2011, 2011

[Alavi, MTT 2012] Morteza Alavi, Robert Bogdan Staszewski, L. C. N. de Vreede, Akshay Vissweswaran, and John Long, "All Digital RF I/Q Modulator," IEEE MTT, vol. 60 issue 11, pp. 3513-3526, 2012.

[Lu ISSCC 2013] Chao Lu, et al. "A 24.7 dBm All-Digital RF Transmitter for Multimode Broadband Application in 40 nm CMOS", in Proc. of IEEE ISCCC, pp. 332-333, February 2013.

[Alavi RFIC 2013] Morteza S. Alavi; George Voicu; Robert B. Staszewski; Leo C. N. de Vreede; John R. Long, A 2×13-bit all-digital I/Q RF-DAC in 65-nm CMOS, 2013 IEEE Radio Frequency Integrated Circuits Symposium (RFIC), 2013

[Alavi MTT 2014] M. S. Alavi, R. G. Staszewski, L. C. N. de Vreede, J. R. Long, A Wideband 2×13-bit All-Digital I/Q RF-DAC, IEEE Transactions on Microwave Theory and Techniques, Volume: 62, Issue: 4, Part: 1, 2014, Page(s): 732-752.

[Deng ISSCC 2016] Z. Deng et al., "A dual-band digital-WiFi 802.11a/b/g/n transmitter SoC with digital I/Q combining and diamond profile mapping for compact die area and improved efficiency in 40 nm CMOS," in IEEE ISSCC Dig. Tech. Papers, February 2016, pp. 172-173.

[Jin 2015] H. Jin et al., "Efficient digital quadrature transmitter based on IQ cell sharing," in IEEE ISSCC Dig. Tech. Papers, February 2015, pp. 168-169.

[Mehrpoo RFIC 2017] M. Mehrpoo, et al., "A wideband linear direct digital RF modulator using harmonic rejection and I/Q-interleaving RF DACs", RFIC2017, pp. 188-191.

[W. Gaber TMTT 2017] W. Gaber, et al., "A 21-dBm I/Q Digital Transmitter Using Stacked Output Stage in 28-nm Bulk CMOS Technology,", TMTT 2017, pp. 4744-4757.

[Shen CICC 2020] Yiyu Shen, Rob Bootsman, Morteza S. Alavi, Leonardus de Vreede, A 0.5-3 GHz I/Q Interleaved Direct-Digital RF Modulator with up to 320 MHz Modulation Bandwidth in 40 nm CMOS, 2020 IEEE Custom Integrated Circuits Conference (CICC), 22-25 Mar. 2020

[Shen, RFIC 2020] Yiyu Shen, Rob Bootsman, Morteza S. Alavi, Leo C. N. De Vreede, A 1-3 GHz I/Q Interleaved Direct-Digital RF Modulator As A Driver for A Common-Gate PA in 40 nm CMOS, RFIC 2020-2020 IEEE Radio Frequency Integrated Circuits Symposium.

[Gaber, TMTT 2017] W. M. Gaber, et al. "A 21-dBm I/Q Digital Transmitter Using Stacked Output Stage in 28-nm Bulk CMOS Technology," TMTT, pp. 4744-4757, 2017.

[Xiong, ISSCC 2019] L. Xiong, et al., "A Broadband Switched-Transformer Digital Power Amplifier for Deep Back-Off Efficiency Enhancement," ISSCC, pp. 76-77, 2019.

[Wang, 2010] Hua Wang, Toru Matsuura, Gregoire le Grand de Mercey, San Jose, Paul Cheng-Po Liang, Koji Takinami, Richard W. D. Booth, Patent No.: U.S. Pat. No. 8,385,469 B2Date of Patent: Feb. 26, 2013, Filed Jan. 20, 2010, Assignee Panasonic Corporation. https://patents.qoogle.com/patent/US8385469

[Matsuura, 2011] Toru Matsuura, Wayne S. Lee, Tomoya Urushihara, Toshifumi Nakatani, Patent High Efficiency Transmitter, Pub. No.: US 2013/0058435 A1, Pub. Date: Mar. 7, 2013. Filed: Sep. 7, 2011. https://patents.google.com/patent/US20130058435A1/en

[Wentzloff et. al., 2019] U.S. Pat. No. 10,200,232 B1, Feb. 5, 2019

[Bootsman, I M S 2020] R. J. Bootsman, D. P. N. Mul, Y. Shen, R. M. Heeres, F. van Rijs, M. S. Alavi, L. C. N. de Vreede, "An 18.5 W Fully-Digital Transmitter with 60.4% Peak System Efficiency," accepted for publication at the IMS 2020 conference, June 2020.

Based on the foregoing introduction, it has become clear that in a DTX, the unit cell 122 is best using a low duty-cycle driver signal (e.g. 25%) to switch-on and off its output stage(s)/segments during an RF cycle. This to achieve good efficiency and at the same time lower the interaction between unit cells 122 driven by different phases (e.g. avoiding compression due to IQ clock overlap in a Cartesian implementation). In a traditional Cartesian DTX, the clock tree is typically implemented using a phase selector 141 that operates directly on these short 25% duty-cycle clock signals $f_{LO,x\_25\%}$, x being a phase indicator (0, 90, 180, 270). FIG. 7 shows a part of a (priori art) Cartesian DTX working with 25% duty-cycle clocks in the clock tree signal distribution. It uses a conventional phase selection scheme implemented in a phase selector 141. Depending on the quadrature sign-bit or in-phase sign-bit the related clock signals are shifted by 180 degree. The resulting phased swapped clock signals with 25% duty-cycle are then used directly after multiplication with the up-sampled baseband data as driving signals in the unit cells 122 to address the targeted quadrants/segments. Note that in these conventional approaches the sign-bit of Q, $Sign_Q$, only acts on the QP and QN related clock signals $CLK_{QP,25\%}$, $CLK_{QN,25\%}$ (e.g. in a push-pull configuration), while the sign-bit of I, $Sign_I$, only acts on the IP and IN related clock signals $CLK_{IP,25\%}$, $CLK_{IN,25\%}$ (e.g. in a push-pull configuration), see also the following table:

| $Sign_Q$ | $Sign_I$ | $CLK_{QP,\,25\%}$ | $CLK_{IP,\,25\%}$ | $CLK_{QN,\,25\%}$ | $CLK_{IN,\,25\%}$ |
|---|---|---|---|---|---|
| 0 | 0 | 90 | 0 | 270 | 180 |
| 0 | 1 | 90 | 180 | 270 | 0 |
| 1 | 1 | 270 | 180 | 90 | 0 |
| 1 | 0 | 270 | 0 | 90 | 180 |

Although relatively simple and straightforward, the use of low duty-cycles in a DTX clock tree give in practical implementations rise to various problems, namely:

Rise and fall times in the clock tree need to be kept very short (compared to using a 50% duty-cycle clock). This requires the use of (much) faster buffers in the clock tree, which makes this approach more power hungry, in addition use of DTX concepts with 25% duty-cycles at higher frequencies become increasingly more challenging.

Low duty-cycle waveforms are not symmetric in nature (in contrast to a waveform having a 50% duty-cycle). This makes these low-duty-cycle signals more prone to signal interference, DC offsets and settling times (e.g. due to the changing sign-bits content).

The above yields timing inaccuracies in practical implementations, which in turn give rise to nonlinearities like LO leakage, limited IQ image rejection, unwanted spectral leakage spurs, and an increase in noise floor of the output spectrum of the generated output signal. As such, existing Cartesian DTX solutions typically face difficulties to meet the spectral requirements as defined by the wireless standards. In multi-phase DTX approaches the targeted duty-cycles might be even smaller (e.g. 12.5% for an eight-phase system using non-overlapping clocks) making the above-mentioned difficulties even more pronounced.

The present invention (see FIG. 11) shows an embodiment that provides a solution to overcoming one or more of the above-identified problems. In a first embodiment therefore, the present invention relates to a controlled segmented RF power transmitter comprising a digital processing part 2 and an RF power amplification part 3 connected to the digital processing part 2. The RF power amplification part 3 comprises a plurality of (possibly adjacent) segments (or unit cells) 122, each segment 122 having an associated activation area, the segments 122 being controlled by an activation scheme for activating specific ones of the segments 122 with a segment driving signal depending on a code word (CWD) received from the digital processing part 2. The digital processing part 2 comprises (in a global sense) a clock generation block 5 being arranged to generate n equi-phased clock signals with a 50% duty-cycle ($f_{LO,x\_50\%}$, $C_x$), x being a phase indicator, n being an integer value equal to or larger than 4, and a sign-bit phase mapper unit (11) being arranged to receive the n equi-phased clock signals with 50% duty-cycle ($f_{LO,x\_50\%}$; $C_x$), and sign signals ($Sign_I$, $Sign_Q$; sign-bits), and to output a set of m, m≤n, phase-mapped clock signals with a 50% duty-cycle ($CLK_{y,50\%}$; $C_y$), y being a phase swap indicator, using a predetermined phase swapping scheme. The clock generation block 5 can e.g. receive a local oscillator signal from a local oscillator unit 107.

Each of the plurality of segments (122), in a local sense, comprises logic circuitry (12) receiving the set of m phase mapped clock signals with a 50% duty-cycle ($CLK_{y,50\%}$; $C_y$), the logic circuitry (12) being arranged to provide the respective segment driving signal with a duty-cycle z of less than 50%. The duty-cycle z is e.g. equal to 12.5%, 25% or 37.5%.

The logic circuitry 12 is e.g. arranged to provide the respective segment driving signal by multiplying predetermined pairs of the set of m phase mapped clock signals with a 50% duty-cycle $CLK_{y,50\%}$, allowing to obtain 25% duty-cycle intermediate signals to eventually obtain the 25% segment driving signal. As stated above, 50% duty-cycle clocks are symmetric in nature. Therefore, they will be less susceptible for parasitic coupling or electrical interference, especially when the clock lines are implemented in a symmetrical fashion. Using these symmetric conditions, it becomes increasingly important that also the logic gates used for constructing the local low duty-cycle upconverting clock and related segment driving signals for the unit cells are fully symmetric to their inputs. Note that most traditional logic gates do not have this feature. E.g., consider FIG. 12A showing a circuit diagram of a conventional NAND logic gate implemented with FET's, in which input A and B are not symmetric, and therefore will not offer precise symmetric loading to the incoming phase mapped clock lines. This could make the DTX again vulnerable for interfering signals, that in such a circuit conditions may give rise to timing errors.

To resolve this, the logic circuitry 1) comprises symmetrical logic circuit gates in a further embodiment. The symmetry needed specifically for the present invention exemplary implementations are e.g. with respect to input loading and transfer function. By making the clock tree and its loading fully symmetric, e.g., by applying a symmetrical logic NAND gate as shown in FIG. 12B, the likelihood that an interference signal might be converted to a timing error is strongly reduced due to the improved common-mode rejection ratio of the applied logic. It is noted as an alternative to the example given for the well-known NAND topology as shown in FIG. 12B, other logical gate families can be used with modifications to make them symmetric in their loading and response to their inputs.

In the following exemplary embodiments of clock arrangements for Cartesian type of DTX implementations, a group of embodiments is described, wherein n is equal to 4.

In generic wording, 50% duty-cycle square-wave local oscillator signals $f_{LO,x\_50\%}$, x being a phase indicator (0, 90, 180, 270), are used in the clock distribution, and the clock phase selector 141 shown and described above with reference to FIG. 7 is replaced by a more advanced sign-bit phase mapper 11, as shown in FIG. 8 for the global clock signal generation implementation in a Cartesian DTX using a 50% duty-cycle LO clocks Sign-bit phase mapper 11 with a predetermined phase swapping scheme to obtain the indicated ($CLK_{y,50\%}$; $C_y$), y being a phase swap indicator.

Local generation of the short duty-cycle (e.g. 25%) upconverting quadrature/multi-phase clocks $CLK_{QP,25\%}$, $CLK_{QN,25\%}$, $CLK_{IP,25\%}$, $CLK_{IN,25}\%$ is enabled at or near the unit cells 122 using logic circuitry 12 with relatively simple (symmetric) logic gates, as described in further detail below and shown in FIG. 9A-C.

The problems of the prior art approaches are all overcome by the proposed invention embodiments, that applies a 50%-LO sign-bit controlled phase mapper 11, while using local (close or near the unit cells) low-duty-cycle upconverting clock signal generation for the unit cells 122 using logic circuitry 12. This method is described below, a graphical illustration of this approach is given in FIG. 8. The following table gives the phase mapping relations for the distribution clocks with 50% duty-cycle in the proposed Cartesian DTX approach, that enables simple local low duty-cycle upconverting clock signal generation for the unit cells 122.

| $Sign_Q$ | $Sign_I$ | $CLK_{QP,\,50\%}$ | $CLK_{IP,\,50\%}$ | $CLK_{QN,\,50\%}$ | $CLK_{IN,\,50\%}$ |
|---|---|---|---|---|---|
| 0 | 0 | 90 | 0 | 270 | 180 |
| 0 | 1 | 180 | 270 | 0 | 90 |
| 1 | 1 | 270 | 180 | 90 | 0 |
| 1 | 0 | 0 | 90 | 180 | 270 |

Thus, in a further embodiment, the predetermined phase swapping scheme is dependent on sign signals $Sign_I$, $Sign_Q$. To obtain the proper m phase mapped clock signals with a 50% duty-cycle $CLK_{y,50\%}$, y being the phase swap indicator, which would eventually allow to obtain the proper 25% duty-cycle clock signals, the above table can be used as the phase swapping scheme.

As one can observe (see the above table, and also FIG. 9B), in this approach the sign-bit of I $Sign_I$ not only impacts the clock signals related to the I operation but also affects the phases of the Q related clocks. A similar situation is present for the Q sign-bit $Sign_Q$. This more advanced 50%-LO Quadrature sign-bit mapper scheme is needed to enable the use of simple multiplication actions (e.g. using logic AND gates) on the resulting clocking signals $CLK_{y,50\%}$ to generate the wanted low duty-cycle upconverting clock signals for the unit cells 122. A possible way to implement this is illustrated in FIGS. 9B and C, showing generation of the local 25% duty-cycle segment driving signals for the unit cells 122 utilizing the proposed 50% LO clock phase swapping scheme by using simple logic (symmetric) gates. FIG. 9B shows which two 50% duty-cycle clock signals $CLK_{QP,50\%}$, $CLK_{QN,50\%}$, $CLK_{IP,50\%}$, $CLK_{IN,50\%}$ are used in this implementation (depending on the sign signals $Sign_I$, $Sign_Q$) to obtain the desired 25% duty-cycle clock signals $CLK_{QP,25\%}$, $CLK_{QN,25\%}$, $CLK_{IP,25\%}$, $CLK_{IN,25\%}$. FIG. 9C then shows how the 25% duty-cycle clock signals $CLK_{QP,25\%}$, $CLK_{QN,25\%}$, $CLK_{IP,25\%}$, $CLK_{IN,25\%}$ are obtained and multiplied to the quadrature signals $I_{BB}$, $Q_{BB}$ and then added to obtain the segment driving signals for the unit cell 122.

An implementation on subsystem level is shown in FIG. 10, which illustrates a Cartesian DTX lineup with sign-bit phase mapper 11 operating on 50% duty-cycle clocks ($f_{LO,x\_50\%}$), x being a phase indicator (0, 90, 180, 270). A set of 50% phase mapped duty-cycle clocks ($CLK_{y,50\%}$), y being a quadrature indicator (IP, IN, QP, QN), are provided as output, which then are used by local low complexity logic (symmetric) gates in logic circuitry 12 to generate the segment driving signals for the unit cells (DPA cells) 122. The local 25% duty-cycle driving signal generation for the unit cell 122 utilizing the proposed 50% LO clock phase swapping scheme is also shown by the indicated multipliers and adder in each unit cell 122.

Note that the proposed clocking scheme can be embedded in a larger DTX configuration that aims for efficiency enhancement in power back off (e.g. a Doherty or outphasing configuration). An example of such a digital intensive four-way transmitter chip is shown schematically in FIG. 11. The DTX has a digital processing part 2 and a RF power amplification part 3. In this exemplary embodiment, the RF power amplification part 3 comprises a plurality of (grouped) segments/unit cells 122 in a push-pull configuration, the outputs of which are combined in a 4-way Doherty power combiner 3a. Note that in a more generic sense, the present invention embodiments relate to a digitally controlled segmented RF power transmitter wherein the RF power amplification part 3 comprises segments 122 arranged to provide push-pull output signals. Alternatively, the arrangements are implemented for single ended output signals.

The digital processing part 2 comprises a digital baseband signal processing block 4, which in this particular exemplary embodiment outputs the upconverted I and Q baseband signals $I_{BB,up}$, $Q_{BB,up}$ for activating all the units cells/segments 122 in the RF power amplification part 3. The digital processing part 2 further comprises a clock signals generation block 5, including baseband clock generation and carrier clock generation (providing the 50% duty-cycle clocks $f_{LO,x\_50\%}$ described above). Furthermore, the digital processing part 2 comprises a clock signal processing block 6, which inter alia comprises the sign-bit phase mapper unit 11, and provides in this Cartesian case the m phase mapped clock signals with a 50% duty-cycle ($CLK_{y,50\%}$) to be used by the logic circuitry 12 in each of the unit cells 122.

In such a complex DTX configuration additional time/delay alignment may be applied to take e.g. the characteristics of the power combiner 3a into account. In a further embodiment, therefore, the digital processing part 2 further comprising a delay alignment unit 16 operating on the n equi-phased clock signals with 50% duty-cycle $f_{LO,x\_50\%}$, the delay alignment unit 16 being connected to inputs of the sign-bit phase mapper unit 11 (and part of the clock signal processing block 6 in the example shown in FIG. 11).

Furthermore, the DTX can be implemented along with a data-aware clock gating scheme to further enhance the energy-efficiency of the entire DTX in power back-off conditions, such as when the related unit cells 122 for the higher power levels are deactivated. This is accomplished in a further embodiment, wherein the digital processing part 2 further comprises a clock gating unit 15 connected to outputs of the sign-bit phase mapper unit 11 and arranged to block the m phase mapped clock signals with a 50% duty-cycle $CLK_{y,50\%}$ if no (active, predetermined) data signal is present in the digital processing part 2, e.g. in the amplitude range associated therewith. Such a data aware clock gating provides energy saving, based on available knowledge of the current input data to the DTX.

In the exemplary embodiment shown in FIG. 11, the RF power amplification part 3 comprises interleaved segments 122. Although the scheme of the logic gates of the logic circuitry 12 described above may suggest that the same DPA unit cell 122 can be used in a single RF period to implement both an I and a Q signal based on the activation of their $I_{BB}$ and/or $Q_{BB}$ signal, this is in practical implementations not the recommended way to use the DPA cells. In fact in a Cartesian DTX, a DPA unit cell 122 can be used within one RF cycle (period) only as IP, QP, IN, QN, or will be inactive during that period. Note that this still allows interleaved operation, since as stated a unit cell 122 can be devoted to any of these phases, as such providing a decent utilization of the output power capability of the available DPA unit cells 122. Using the DPA unit cell 122 to represent only one of these signal "vectors" within one RF cycle, has the effect of better isolating the related I/Q symbols, due to unavoidable rise and fall times. This yields a well-defined consistent contribution to the output signal power with low interaction between the I and Q signal content. Furthermore, following this approach the speed of the up-sampled baseband signal stays more relaxed as well. Note that push-pull operation can be considered as two independent unit cells that share some clock or data logic (e.g. to handle the up-sampled baseband data). In summary, the benefits of the proposed 50% duty-cycle clock distribution and local generation of the segment drive signals with low duty-cycle (using 50%-LO clock tree distribution with correct sign-bit operation) are:

Lower impact clock line coupling and parasitics
More immunity to duty-cycle distortion
More robust LO signal handling in clock trees
Less power consumption
More linear/high quality output spectrum At the same time, it is possible to implement a DTX interleaved switch bank operation, yielding half the PA switch-bank size cell size compared to conventional non interleaved I/Q approaches. This yields less output parasitics and thus a higher efficiency. Also, a Cartesian DTX with 25% duty-cycle segment drive signals fed to the unit cells 122 can be implemented.

The approach described above of using 50% duty-cycle clocks with a sign-bit phase mapper unit 11 for locally generating the low duty-cycle upconverting clock signals $CLK_{y,z\%}$ in signed Cartesian DTX implementations can also be extended for use in improved versions of multi-phase DTX (i.e. n larger than 4). In fact, also the duty-cycle z of the upconverting local clock signal $CLK_{y,z\%}$ can be selected. For this purpose, first a general scheme is described and applied to the previously discussed Cartesian DTX.

The following table represents the four incoming 50% duty-cycle clocks using a different notation $C_y$, y being a phase indicator, presented in the tables as C1-C4 representing clock signals which are phase shifted over the RF period in four 90 degree steps.

| | | | | |
|---|---|---|---|---|
| C1 | 0 | 1 | 1 | 0 |
| C2 | 1 | 1 | 0 | 0 |
| C3 | 1 | 0 | 0 | 1 |
| C4 | 0 | 0 | 1 | 1 |

The following table shows the local 25% duty-cycle upconversion clocks $K_y$, y being a phase indicator, presented in the table as clock signals K1-K4 that are needed in driving the unit cells 122 to operate along one of the axes of the quadrant (see FIG. 13A).

| | | | | |
|---|---|---|---|---|
| K1 | 0 | 1 | 0 | 0 |
| K2 | 1 | 0 | 0 | 0 |
| K3 | 0 | 0 | 0 | 1 |
| K4 | 0 | 0 | 1 | 0 |

The next table then gives the logic operations needed to create these $K_y$ signals using the 50% duty-cycle clocks $C_y$ as input.

| |
|---|
| $K1 = C1 \cdot C2$ |
| $K2 = C2 \cdot C3$ |
| $K3 = C3 \cdot C4$ |
| $K4 = C4 \cdot C1$ |

FIG. 13B shows a possible logic circuit 12 configuration that takes the phase mapped 50% LO clocks ($C_{A1push}$, $C_{A2push}$, $O_{B1push}$, $C_{B2push}$; $C_{A1pull}$, $C_{A2pull}$, $C_{B1pull}$, $C_{B2pull}$) to create the segment driving signals via the 25% upconverting LO clock signals ($K_{Apush}$, $K_{Bpush}$; $K_{Apull}$, $K_{Apull}$) and the I and Q signals $I_up$, $Q_{up}$. A push-pull case is shown, note that for a single ended implementation only the push or pull part needs to be considered.

The following table links the sign-bits to the quadrants and the needed upconverting LO clock signals ($K_y$) with their related input ($C_y$) using FIG. 13B. This is possible, since the inputs of an AND gate (logic multiplication) can be interchanged without any consequence.

| 25% duty-cycle sign bit mapper table Cartesian case | | | | | | | | | | | | | |
|---|---|---|---|---|---|---|---|---|---|---|---|---|---|
| quadrant | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| Q1 | 00 | C1 | C2 | K1 | C2 | C3 | K2 | C3 | C4 | K3 | C4 | C1 | K4 |
| Q2 | 01 | C3 | C4 | K3 | C2 | C3 | K2 | C1 | C2 | K1 | C4 | C1 | K4 |
| Q3 | 10 | C3 | C4 | K3 | C4 | C1 | K4 | C1 | C2 | K1 | C2 | C3 | K2 |
| Q4 | 11 | C1 | C2 | K1 | C4 | C1 | K4 | C3 | C4 | K3 | C2 | C3 | K2 |

Rearranging yields the following table, which indicates which logic inputs can be connected to the same output of the sign-bit phase mapper unit 11, which in combination with the use of symmetric logic gates yields a balanced loading of the clock tree lines, which carries the 50% duty-cycle that are phase mapped by the sign-bit mapper.

25% duty-cycle sign bit mapper table Cartesian case, regrouped in order to match with previous figures

| quadrant | Sign bit | $C_{A1push}$ (CLK$_{IP,\,50\%}$) | $C_{A2push}$ (CLK$_{QP,\,50\%}$) | $K_{Apush}$ | $C_{B1push}$ (CLK$_{QP,\,50\%}$) | $C_{B2push}$ (CLK$_{IN,\,50\%}$) | $K_{Bpush}$ |
|---|---|---|---|---|---|---|---|
| Q1 | 00 | C1 | C2 | K1 | C2 | C3 | K2 |
| Q2 | 01 | C4 | C3 | K3 | C3 | C2 | K2 |
| Q3 | 10 | C3 | C4 | K3 | C4 | C1 | K4 |
| Q4 | 11 | C2 | C1 | K1 | C1 | C4 | K4 |

| quadrant | $C_{A1pull}$ (CLK$_{IN,\,50\%}$) | $C_{A2pull}$ (CLK$_{QN,\,50\%}$) | $K_{Apull}$ | $C_{B1pull}$ (CLK$_{QN,\,50\%}$) | $C_{B2pull}$ (CLK$_{IP,\,50\%}$) | $K_{Bpull}$ |
|---|---|---|---|---|---|---|
| Q1 | C3 | C4 | K3 | C4 | C1 | K4 |
| Q2 | C2 | C1 | K1 | C1 | C4 | K4 |
| Q3 | C1 | C2 | K1 | C2 | C3 | K2 |
| Q4 | C4 | C3 | K3 | C3 | C2 | K2 |

Note that the resulting table also allows straightforward comparison with the earlier figures and tables described above. Note that due to the 50% clock duty-cycle used in the distribution, the clock lines in this particular case can be implemented as four individual clock lines or two times a differential clock line, as can be concluded from the inspection of the following table, in which "CyN" represents the negative of the "Cy", or in other words the 180 degree rotated or time shifted clock.

25% duty-cycle sign bit mapper table Cartesian case, regrouped in order to match with previous figures

| quadrant | Sign bit | $C_{A1push}$ (CLK$_{IP,\,50\%}$) | $C_{A2push}$ (CLK$_{QP,\,50\%}$) | $K_{Apush}$ | $C_{B1push}$ (CLK$_{QP,\,50\%}$) | $C_{B2push}$ (CLK$_{IN,\,50\%}$) | $K_{Bpush}$ |
|---|---|---|---|---|---|---|---|
| Q1 | 00 | C1 | C2 | K1 | C2 | C1N | K2 |
| Q2 | 01 | C2N | C1N | K3 | C1N | C2 | K2 |
| Q3 | 10 | C1N | C2N | K3 | C2N | C1 | K4 |
| Q4 | 11 | C2 | C1 | K1 | C1 | C2N | K4 |

| quadrant | $C_{A1pull}$ (CLK$_{IN,\,50\%}$) | $C_{A2pull}$ (CLK$_{QN,\,50\%}$) | $K_{Apull}$ | $C_{B1pull}$ (CLK$_{QN,\,50\%}$) | $C_{B2pull}$ (CLK$_{IP,\,50\%}$) | $K_{Bpull}$ |
|---|---|---|---|---|---|---|
| Q1 | C1N | C2N | K3 | C1N | C1 | K4 |
| Q2 | C2 | C1 | K1 | C1 | C2N | K4 |
| Q3 | C1 | C2 | K1 | C2 | C1N | K2 |
| Q4 | C2N | C1N | K3 | C1N | C2 | K2 |

Further embodiments of the present invention relate to multi-phase Cartesian DTX systems using a sign-bit phase mapper unit 11 with 50% duty-cycle clock signals $C_y$ for DTX clock distribution, with local generation of the low duty-cycle unit cell segment driving signals. In a further subgroup, n is equal to 8 for an eight-phase DTX implementation. Below exemplary embodiments are described for varying duty-cycles of 12.5%, 25% or 37.5%. Comparable concept implementations can also be applied in a multi-phase DTX system featuring a different number of phases. When the proposed invention embodiment is applied in such eight-phase DTX the situation of FIG. 14 applies, which shows an example of an eight-phase (multi-phase) DTX clock tree using 50% duty-cycle LO clocks $C_x$ for the signal distribution, an octal (3 bit) sign-bit phase mapper unit 11 using a dedicated phase swapping scheme, an optional clock gating unit 15 and local generation of the low duty-cycle driving signals for each unit cell 122 using local circuitry 12. The configuration shown provides the activation signals for a push-pull implementation.

In this scenario, the clock phase generator (not shown) will provide eight 50% output signals $C_x$ with phases that are equally distributed over one RF period (or alternatively over 360 degree). This yields an effective phase shift between these signals $C_x$ of 45 degree at the RF operating frequency. These eight clocks $C_x$ are fed to a sign-bit phase mapper unit 11, that based on the (three) sign-bits, swaps the available clocks $C_x$ to its output in a particular order such that simple logic operations (logic circuitry 12) in or at the unit cells 122 fed by these 50% duty-cycle phase shifted clocks $C_y$ can generate the desired low duty-cycle segment driving signals. Retiming of the swapped clocks might be implemented at the output of the sign-bit phase mapper unit 11 (similar as described for the exemplary embodiment of FIG. 11 above). Also, an optional data-aware clock gating unit 15 can be implemented to enhance the energy-efficiency of the DTX system by saving clock tree power in power back off conditions.

In the following, an exemplary embodiment is described, wherein the logic circuitry 12 is arranged to multiply predetermined pairs of the m phase mapped clock signals with a 50% duty-cycle $C_y$ to obtain local segment driving signals with a duty-cycle of 12.5% (using intermediate upconverting LO clock signals $K_y$).

When aiming for an eight-phase interleaved DTX without overlapping clocks, a (local) 12.5% duty-cycle upconverting low duty-cycle LO clock signal $K_y$ is used for obtaining the segment driving signal to the unit cell(s) 122. These signals can be created by multiplying (bitwise AND logic function) the appropriate time and phase mapped 50% duty-cycle clock signals $C_y$. In the following three tables, the phase shifted 50% duty-cycle clocks $C_y$ are represented in the left table, the 12.5% local low duty-cycle LO clock signal $K_y$ at all possible eight-phases in the right table, and the multiplications that yield the 12.5% local low duty-cycle LO clock signals $K_y$ in the middle table.

In the single-ended case the four inputs for the (symmetric) logic circuitry 12 would produce locally at or in the unit cell 122 the two needed low duty-cycle upconverting LO clock signals $K_y$ (signals $K_A$, $K_B$) based on four 50% duty-cycle clocks $C_y$ ($C_{A1}$, $C_{A2}$, $C_{B1}$, $C_{B2}$) with different phase. Such a switch bank structure would thus need four clock lines $C_x$ connected to the sign-bit phase mapper unit 11, that provides the proper mapping scheme for the 50% duty-cycle clocks $C_y$ with different phases to create the desired phase modulated low duty-cycle upconverting LO clock signals $K_y$, that have the correct phase and duty-cycle for the targeted segment. Note that when going to an

| 50% Global | | | | | | | | | | 12.5% Local Generation | | | | | | | |
|---|---|---|---|---|---|---|---|---|---|---|---|---|---|---|---|---|---|
| C1 | 0 | 0 | 1 | 1 | 1 | 1 | 0 | 0 | K1 = C1 · C4 | K1 | 0 | 0 | 1 | 0 | 0 | 0 | 0 | 0 |
| C2 | 0 | 1 | 1 | 1 | 1 | 0 | 0 | 0 | K2 = C2 · C5 | K2 | 0 | 1 | 0 | 0 | 0 | 0 | 0 | 0 |
| C3 | 1 | 1 | 1 | 1 | 0 | 0 | 0 | 0 | K3 = C3 · C6 | K3 | 1 | 0 | 0 | 0 | 0 | 0 | 0 | 0 |
| C4 | 1 | 1 | 1 | 0 | 0 | 0 | 0 | 1 | K4 = C4 · C7 | K4 | 0 | 0 | 0 | 0 | 0 | 0 | 0 | 1 |
| C5 | 1 | 1 | 0 | 0 | 0 | 0 | 1 | 1 | K5 = C5 · C8 | K5 | 0 | 0 | 0 | 0 | 0 | 0 | 1 | 0 |
| C6 | 1 | 0 | 0 | 0 | 0 | 1 | 1 | 1 | K6 = C6 · C1 | K6 | 0 | 0 | 0 | 0 | 0 | 1 | 0 | 0 |
| C7 | 0 | 0 | 0 | 0 | 1 | 1 | 1 | 1 | K7 = C7 · C2 | K7 | 0 | 0 | 0 | 0 | 1 | 0 | 0 | 0 |
| C8 | 0 | 0 | 0 | 1 | 1 | 1 | 1 | 0 | K8 = C8 · C3 | K8 | 0 | 0 | 0 | 1 | 0 | 0 | 0 | 0 |

The next step is then to identify the possible sign-bit mapper phase relations that allow to generate the local phase modulated upconverting LO clock signals $K_y$. In this case the sign-bit phase mapper unit 11 is controlled by 3 sign-bits since 8 phases are required to cover the 8 sectors of the IQ constellation diagram as shown in FIG. 15. To be able to generate all possible phases with simple logic gate circuitry 12 in or near the unit cell 122, if all phases need to be available at the same time, all 8 phase mapped upconverting LO clock signals $K_y$ would be needed. However, in a practical single-ended DTX configuration only two low duty-cycle $K_y$ signals are needed within one RF period to address a segment (or quadrant in the case of a Cartesian DTX), while in a push-pull configuration four low duty-cycle $K_y$ signals are needed within one RF cycle to address two opposite segments (or quadrant in the case of a Cartesian DTX) since the push and pull segments are 180 degree apart. As such, not all $K_y$ signals in the table are needed within one RF period. In fact, to address a point in the desired segment of the IQ constellation diagram in a single-ended system, e.g., indicated in FIG. 15 by the arrows in segment I, the system only requires two $K_y$ signals within a single RF cycle, while a push-pull implementation (adding the arrows in segment V in FIG. 15) would need 4 $K_y$ phase modulated LO signals. As such in a practical push-pull multi-phase system only 4 $K_y$ local low duty-cycle LO signals within an RF cycle are needed. Consequently, there is no real need to process all 8 possible $K_y$ upconverting LO clock signals at all times, since this would increase the clock tree power consumption of the DTX. These conclusions would also apply to higher order, multi-phase DTX systems (e.g. 16 phases or 32 phases). Closer inspections yield the conclusion that when a similar structure is used for the logic circuitry 12 as in the Cartesian DTX to create the local upconverting LO clock signal in a multi-phase DTX the following situation is achieved.

adjacent neighboring segment, preferably only one $K_y$ signal should be changed for its phase, this to avoid the switching of hot/large vectors that might introduce unwanted glitches in the output signal.

In the push-pull case in general eight inputs ($C_{A1push}$, $C_{A2push}$, $C_{B1push}$, $C_{B2push}$, $C_{A1pull}$, $C_{A2pull}$, $C_{B1pull}$, $C_{B2pull}$) are needed for the (symmetric) gate logic circuitry 12 to produce the four required local $K_y$ signals ($K_{Apush}$, $K_{Bpush}$, $K_{Apull}$, $K_{Bpull}$). Closer inspection shows that (in this specific 12.5% duty-cycle case) six 50% duty-cycle clocks $C_y$ are needed with different phases. Consequently, one could share some of the clock lines to drive multiple gate inputs, however doing so might cause an unbalance that can lead to timing differences that would raise the spectral leakage of the DTX. Therefore, it is better to use eight clock lines with eight clocks in the distribution, while duplicating two of the six different clock signals in the sign-bit phase mapper unit 11, e.g. followed by a retiming step. In such a configuration the loading of clock lines in terms of logic gates is identical, which would yield the lowest timing errors. Consequently, a push-pull multi-phase switch bank structure would thus need eight clock lines $C_x$ connected to the sign-bit phase mapper unit 11, that provides the proper mapping scheme for the 50% duty-cycle clocks $C_y$. In this 12.5% case this will be six different phases plus two duplicates needed to create four phase modulated upconverting LO signals $K_y$, that have the correct phase and duty-cycle for the push-pull operation of the targeted segment. Be aware that this is different for other duty-cycles than 12.5%, in these cases all eight 50% LO signals $C_y$ can be needed. Furthermore, when going to an adjacent neighboring segment, preferably only two of the LO signals should be changed in the push-pull configuration based on the segment phase, this to avoid switching of hot or large vectors that might introduce unwanted glitches in the output signal.

The following table shows a possible sign-bit based mapping of the 50% duty-cycle signals $C_y$, that in combination with the inputs of the logic circuitry provide the low duty-cycle upconverting LO $K_y$ signals needed in the creation of the segment driving signals for the unit cells 122.

| 12.5% duty-cycle sign bit mapper table | | | | | | | | | | | | | |
|---|---|---|---|---|---|---|---|---|---|---|---|---|---|
| Segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C1 | C4 | K1 | C2 | C5 | K2 | C5 | C8 | K5 | C6 | C1 | K6 |
| B | 001 | C3 | C6 | K3 | C2 | C5 | K2 | C7 | C2 | K7 | C6 | C1 | K6 |
| C | 010 | C3 | C6 | K3 | C4 | C7 | K4 | C7 | C2 | K7 | C8 | C3 | K8 |
| D | 011 | C5 | C8 | K5 | C4 | C7 | K4 | C1 | C4 | K1 | C8 | C3 | K8 |
| E | 100 | C5 | C8 | K5 | C6 | C1 | K6 | C1 | C4 | K1 | C2 | C5 | K2 |
| F | 101 | C7 | C2 | K7 | C6 | C1 | K6 | C3 | C6 | K3 | C2 | C5 | K2 |
| G | 110 | C7 | C2 | K7 | C8 | C3 | K8 | C3 | C6 | K3 | C4 | C7 | K4 |
| H | 111 | C1 | C4 | K1 | C8 | C3 | K8 | C5 | C8 | K5 | C4 | C7 | K4 |

In the following table, the entries are organized such that some of the AND gates inputs can be driven by the same signal(s):

| 12.5% duty-cycle sign bit mapper table | | | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C1 | C4 | K1 | C2 | C5 | K2 | C5 | C8 | K5 | C6 | C1 | K6 |
| B | 001 | C6 | C3 | K3 | C5 | C2 | K2 | C2 | C7 | K7 | C1 | C6 | K6 |
| C | 010 | C3 | C6 | K3 | C4 | C7 | K4 | C7 | C2 | K7 | C8 | C3 | K8 |
| D | 011 | C8 | C5 | K5 | C7 | C4 | K4 | C4 | C1 | K1 | C3 | C8 | K8 |
| E | 100 | C5 | C8 | K5 | C6 | C1 | K6 | C1 | C4 | K1 | C2 | C5 | K2 |
| F | 101 | C2 | C7 | K7 | C1 | C6 | K6 | C6 | C3 | K3 | C5 | C2 | K2 |
| G | 110 | C7 | C2 | K7 | C8 | C3 | K8 | C3 | C6 | K3 | C4 | C7 | K4 |
| H | 111 | C4 | C1 | K1 | C3 | C8 | K8 | C8 | C5 | K5 | C7 | C4 | K4 |

Due to the 50% clock duty-cycle used in the distribution, the clock lines in this particular case can be implemented as eight individual clock lines $C_y$ (assuming duplication of two clock signals, otherwise six) or four times a differential clock line (assuming duplication of two clock signals, otherwise three), as can be concluded from the inspection of the following table, in which "CyN" represents the negative of the $C_y$, or in other words the 180 degree rotated or time shifted clock. In the next table, differential clock signals are thus used as described above:

low duty-cycle upconverting LO clock signals $K_y$. Note that this yields in this multi-phase approach to overlap in the low-duty-cycle upconverting LO clock signals $K_y$ used for the creation of the unit cell 122 driving signals. This somewhat increases the interaction between unit cells 122 activated by different phases, but yields higher output power while relaxing the speed requirements in the clock tree and unit cells 122 of the DTX. Note that the $K_y$ upconverting LO clock signals are constructed using different clock phases, which affects the entries of the 25% duty-cycle sign-bit mapper table. In this embodiment the logic circuitry 12 is thus arranged to multiply predetermined pairs of the m phase mapped clock signals with a 50% duty-cycle $C_y$ to obtain

| 12.5% duty-cycle sign bit mapper table | | | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C1 | C4 | K1 | C2 | C1N | K2 | C1N | C4N | K5 | C2N | C1 | K6 |
| B | 001 | C2N | C3 | K3 | C1N | C2 | K2 | C2 | C3N | K7 | C1 | C6 | K6 |
| C | 010 | C3 | C2N | K3 | C4 | C3N | K4 | C3N | C2 | K7 | C4N | C3 | K8 |
| D | 011 | C4N | C1N | K5 | C3N | C4 | K4 | C4 | C1 | K1 | C3 | C4N | K8 |
| E | 100 | C1N | C4N | K5 | C2N | C1 | K6 | C1 | C4 | K1 | C2 | C5 | K2 |
| F | 101 | C2 | C3N | K7 | C1 | C2N | K6 | C2N | C3 | K3 | C1N | C2 | K2 |
| G | 110 | C3N | C2 | K7 | C4N | C3 | K8 | C3 | C2N | K3 | C4 | C3N | K4 |
| H | 111 | C4 | C1 | K1 | C3 | C4N | K8 | C4N | C1N | K5 | C3N | C4 | K4 |

It is noted that phase rotated versions of these tables or the segments shown in FIG. 15 are possible as implementations yielding comparable results as long as it is done in a consistent manner.

With reference to FIG. 14, the inputs of the AND logic gates in logic circuitry 12 (e.g. $A_{1push}$ and $A_{2push}$) can be interchanged without affecting the desired operation.

As a further example, another embodiment of an eight-phase DTX is described using a 25% duty-cycle for the local local segment driving signals with a duty-cycle of 25% (e.g. via upconverting LO clock signals $K_y$).

This is shown in the following tables representing (left) the eight-phase shifted 50% duty-cycle clocks $C_y$, (middle) the related multiplications to generate (right) the required 25% duty-cycle locally generated upconverting LO clock signals $K_y$.

| 50% Global | | | | | | | | | | 25% Local Generation | | | | | | | | |
|---|---|---|---|---|---|---|---|---|---|---|---|---|---|---|---|---|---|---|
| C1 | 0 | 0 | 1 | 1 | 1 | 1 | 0 | 0 | K1 = C1 · C3 | K1 | 0 | 0 | 1 | 1 | 0 | 0 | 0 | 0 |
| C2 | 0 | 1 | 1 | 1 | 1 | 0 | 0 | 0 | K2 = C2 · C4 | K2 | 0 | 1 | 1 | 0 | 0 | 0 | 0 | 0 |
| C3 | 1 | 1 | 1 | 1 | 0 | 0 | 0 | 0 | K3 = C3 · C5 | K3 | 1 | 1 | 1 | 0 | 0 | 0 | 0 | 0 |
| C4 | 1 | 1 | 1 | 0 | 0 | 0 | 0 | 1 | K4 = C4 · C6 | K4 | 1 | 0 | 0 | 0 | 0 | 0 | 0 | 1 |
| C5 | 1 | 1 | 0 | 0 | 0 | 0 | 1 | 1 | K5 = C5 · C7 | K5 | 0 | 0 | 0 | 0 | 0 | 0 | 1 | 1 |
| C6 | 1 | 0 | 0 | 0 | 0 | 1 | 1 | 1 | K6 = C6 · C8 | K6 | 0 | 0 | 0 | 0 | 0 | 1 | 1 | 0 |
| C7 | 0 | 0 | 0 | 0 | 1 | 1 | 1 | 1 | K7 = C7 · C1 | K7 | 0 | 0 | 0 | 0 | 1 | 1 | 0 | 0 |
| C8 | 0 | 0 | 0 | 1 | 1 | 1 | 1 | 0 | K8 = C8 · C2 | K8 | 0 | 0 | 0 | 1 | 1 | 0 | 0 | 0 |

The following table shows a possible sign-bit based mapping of the 50% duty-cycle clock signals $C_y$ that in combination with the inputs of the logic circuitry 12 provide the low duty-cycle upconverting LO clock $K_y$ signals needed in the creation of the driving signals for the unit cells 122.

signals with a 50% duty-cycle $C_y$ to obtain local segment driving signals with a duty-cycle of 37.5%. This results in even more overlap in the low-duty-cycle upconverting LO clock signals $K_y$ that are used to generate the driving signal for the unit cell 122. This again somewhat increases the

| | | 25% duty-cycle sign bit mapper table | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C1 | C3 | K1 | C2 | C4 | K2 | C5 | C7 | K5 | C6 | C8 | K6 |
| B | 001 | C3 | C5 | K3 | C2 | C4 | K2 | C7 | C1 | K7 | C6 | C8 | K6 |
| C | 010 | C3 | C5 | K3 | C4 | C6 | K4 | C7 | C1 | K7 | C8 | C2 | K8 |
| D | 011 | C5 | C7 | K5 | C4 | C6 | K4 | C1 | C3 | K1 | C8 | C2 | K8 |
| E | 100 | C5 | C7 | K5 | C6 | C8 | K6 | C1 | C3 | K1 | C2 | C4 | K2 |
| F | 101 | C7 | C1 | K7 | C6 | C8 | K6 | C3 | C5 | K3 | C2 | C4 | K2 |
| G | 110 | C7 | C1 | K7 | C8 | C2 | K8 | C3 | C5 | K3 | C4 | C6 | K4 |
| H | 111 | C1 | C3 | K1 | C8 | C2 | K8 | C5 | C7 | K5 | C4 | C6 | K4 |

In the following table the above table is reorganized such that less swapping of the clock signals $C_y$ is needed. Note that all eight 50% clock signals $C_y$ are needed in a push-pull 25% local clock generation.

interaction between unit cells 122 activated by a different phase, but yields even higher output powers while further relaxing the speed requirements in the clock tree and unit cells 122 of the DTX. Furthermore, the use of 37.5%

| | | 25% duty-cycle sign bit mapper table | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C3 | C1 | K1 | C2 | C4 | K2 | C7 | C5 | K5 | C6 | C8 | K6 |
| B | 001 | C3 | C5 | K3 | C2 | C4 | K2 | C7 | C1 | K7 | C6 | C8 | K6 |
| C | 010 | C3 | C5 | K3 | C6 | C4 | K4 | C7 | C1 | K7 | C2 | C8 | K8 |
| D | 011 | C7 | C5 | K5 | C6 | C4 | K4 | C3 | C1 | K1 | C2 | C8 | K8 |
| E | 100 | C7 | C5 | K5 | C6 | C8 | K6 | C3 | C1 | K1 | C2 | C4 | K2 |
| F | 101 | C7 | C1 | K7 | C6 | C8 | K6 | C3 | C5 | K3 | C2 | C4 | K2 |
| G | 110 | C7 | C1 | K7 | C2 | C8 | K8 | C3 | C5 | K3 | C6 | C4 | K4 |
| H | 111 | C3 | C1 | K1 | C2 | C8 | K8 | C7 | C5 | K5 | C6 | C4 | K4 |

In the following table, again differential clock lines are being applied.

duty-cycle clocks, results in a significantly lower $3^{rd}$ harmonic content compared with the foregoing solutions.

| | | 25% duty-cycle sign bit mapper table | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C3 | C1 | K1 | C2 | C4 | K2 | C3N | C1N | K5 | C2N | C4N | K6 |
| B | 001 | C3 | C1N | K3 | C2 | C4 | K2 | C3N | C1 | K7 | C2N | C4N | K6 |
| C | 010 | C3 | C1N | K3 | C2N | C4 | K4 | C3N | C1 | K7 | C2 | C4N | K8 |
| D | 011 | C3N | C1N | K5 | C2N | C4 | K4 | C3 | C1 | K1 | C2 | C4N | K8 |
| E | 100 | C3N | C1N | K5 | C2N | C4N | K6 | C3 | C1 | K1 | C2 | C4 | K2 |
| F | 101 | C3N | C1 | K7 | C2N | C4N | K6 | C3 | C1N | K3 | C2 | C4 | K2 |
| G | 110 | C3N | C1 | K7 | C2 | C4N | K8 | C3 | C1N | K3 | C2N | C4 | K4 |
| H | 111 | C3 | C1 | K1 | C2 | C4N | K8 | C3N | C1N | K5 | C2N | C4 | K4 |

In another embodiment of an eight-phase DTX, a 37.5% duty-cycle is used for the local low duty-cycle upconverting LO clock signals $K_y$. I.e. the logic circuitry 12 is arranged to multiply predetermined pairs of the m phase mapped clock An example of this embodiment is given in the following tables. Note that the $K_y$ signals are constructed using different clock phases $C_y$, which affects the entries of the 37.5% duty-cycle sign-bit mapper table.

| | 50% Global | | | | | | | | | 37.5% Local Generation | | | | | | | |
|---|---|---|---|---|---|---|---|---|---|---|---|---|---|---|---|---|---|
| C1 | 0 | 0 | 1 | 1 | 1 | 1 | 0 | 0 | K1 = C1 · C2 | K1 | 0 | 0 | 1 | 1 | 1 | 0 | 0 | 0 |
| C2 | 0 | 1 | 1 | 1 | 1 | 0 | 0 | 0 | K2 = C2 · C3 | K2 | 0 | 1 | 1 | 1 | 0 | 0 | 0 | 0 |
| C3 | 1 | 1 | 1 | 1 | 0 | 0 | 0 | 0 | K3 = C3 · C4 | K3 | 1 | 1 | 1 | 0 | 0 | 0 | 0 | 0 |
| C4 | 1 | 1 | 1 | 0 | 0 | 0 | 0 | 1 | K4 = C4 · C5 | K4 | 1 | 1 | 0 | 0 | 0 | 0 | 0 | 1 |
| C5 | 1 | 1 | 0 | 0 | 0 | 0 | 1 | 1 | K5 = C5 · C6 | K5 | 1 | 0 | 0 | 0 | 0 | 0 | 1 | 1 |
| C6 | 1 | 0 | 0 | 0 | 0 | 1 | 1 | 1 | K6 = C6 · C7 | K6 | 0 | 0 | 0 | 0 | 0 | 1 | 1 | 1 |
| C7 | 0 | 0 | 0 | 0 | 1 | 1 | 1 | 1 | K7 = C7 · C8 | K7 | 0 | 0 | 0 | 0 | 1 | 1 | 1 | 0 |
| C8 | 0 | 0 | 0 | 1 | 1 | 1 | 1 | 0 | K8 = C8 · C1 | K8 | 0 | 0 | 0 | 1 | 1 | 1 | 0 | 0 |

The following table shows a possible sign-bit based mapping of the 50% duty-cycle clock signals $C_y$, that in combination with the inputs of the logic circuitry 12 provide the low duty-cycle upconverting LO clock signals $K_y$ needed in the creation of the driving signals for the unit cells 122.

be used to generate inverted 25% duty-cycle clock signals from the 50% LO clock phases for use in (pseudo) differential drivers. In these alternative embodiments, the RF power amplification part 3 comprises circuitry providing complementary signals to drive the segments 122. Such a

| | | 37.5% duty-cycle sign bit mapper table | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C1 | C2 | K1 | C2 | C3 | K2 | C5 | C6 | K5 | C6 | C7 | K6 |
| B | 001 | C3 | C4 | K3 | C2 | C3 | K2 | C7 | C8 | K7 | C6 | C7 | K6 |
| C | 010 | C3 | C4 | K3 | C4 | C5 | K4 | C7 | C8 | K7 | C8 | C1 | K8 |
| D | 011 | C5 | C6 | K5 | C4 | C5 | K4 | C1 | C2 | K1 | C8 | C1 | K8 |
| E | 100 | C5 | C6 | K5 | C6 | C7 | K6 | C1 | C2 | K1 | C2 | C3 | K2 |
| F | 101 | C7 | C8 | K7 | C6 | C7 | K6 | C3 | C4 | K3 | C2 | C3 | K2 |
| G | 110 | C7 | C8 | K7 | C8 | C1 | K8 | C3 | C4 | K3 | C4 | C5 | K4 |
| H | 111 | C1 | C2 | K1 | C8 | C1 | K8 | C5 | C6 | K5 | C4 | C5 | K4 |

The following table is organized such that some of the AND gate inputs in the logic circuitry can be driven by the same signal(s):

further DTX embodiment is arranged for achieving higher transmit powers, and is using e.g. LDMOS or GaN technologies for the implementation of the unit cells 122.

| | | 37.5% duty-cycle sign bit mapper table | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C2 | C1 | K1 | C2 | C3 | K2 | C5 | C6 | K5 | C6 | C7 | K6 |
| B | 001 | C3 | C4 | K3 | C3 | C2 | K2 | C8 | C7 | K7 | C7 | C6 | K6 |
| C | 010 | C4 | C3 | K3 | C4 | C5 | K4 | C7 | C8 | K7 | C8 | C1 | K8 |
| D | 011 | C5 | C6 | K5 | C5 | C4 | K4 | C2 | C1 | K1 | C1 | C8 | K8 |
| E | 100 | C6 | C5 | K5 | C6 | C7 | K6 | C1 | C2 | K1 | C2 | C3 | K2 |
| F | 101 | C7 | C8 | K7 | C7 | C6 | K6 | C4 | C3 | K3 | C3 | C2 | K2 |
| G | 110 | C8 | C7 | K7 | C8 | C1 | K8 | C3 | C4 | K3 | C4 | C5 | K4 |
| H | 111 | C1 | C2 | K1 | C1 | C8 | K8 | C6 | C5 | K5 | C5 | C4 | K4 |

Similar to the 12.5% and 25% duty-cycle examples described above, the following table provided the sign-bit based mapping when using differential clock lines.

However, these RF power oriented semiconductor technologies often require a high voltage swing to effectively drive the gate (segments) of their devices. Unfortunately, high

| | | 37.5% duty-cycle sign bit mapper table | | | | | | | | | | | |
|---|---|---|---|---|---|---|---|---|---|---|---|---|---|
| segment | Sign bit | $C_{A1push}$ | $C_{A2push}$ | $K_{Apush}$ | $C_{B1push}$ | $C_{B2push}$ | $K_{Bpush}$ | $C_{A1pull}$ | $C_{A2pull}$ | $K_{Apull}$ | $C_{B1pull}$ | $C_{B2pull}$ | $K_{Bpull}$ |
| A | 000 | C2 | C1 | K1 | C2 | C3 | K2 | C1N | C2N | K5 | C2N | C3N | K6 |
| B | 001 | C3 | C4 | K3 | C3 | C2 | K2 | C4N | C3N | K7 | C3N | C2N | K6 |
| C | 010 | C4 | C3 | K3 | C4 | C1N | K4 | C3N | C4N | K7 | C4N | C1 | K8 |
| D | 011 | C1N | C2N | K5 | C1N | C4 | K4 | C2 | C1 | K1 | C1 | C4N | K8 |
| E | 100 | C2N | C1N | K5 | C2N | C3N | K6 | C1 | C2 | K1 | C2 | C3 | K2 |
| F | 101 | C3N | C4N | K7 | C3N | C2N | K6 | C4 | C3 | K3 | C3 | CZ | K2 |
| G | 110 | C4N | C3N | K7 | C4N | C1 | K8 | C3 | C4 | K3 | C4 | C1N | K4 |
| H | 111 | C1 | C2 | K1 | C1 | C4N | K8 | C2N | C1N | K5 | C1N | C4 | K4 |

Figure 16B:
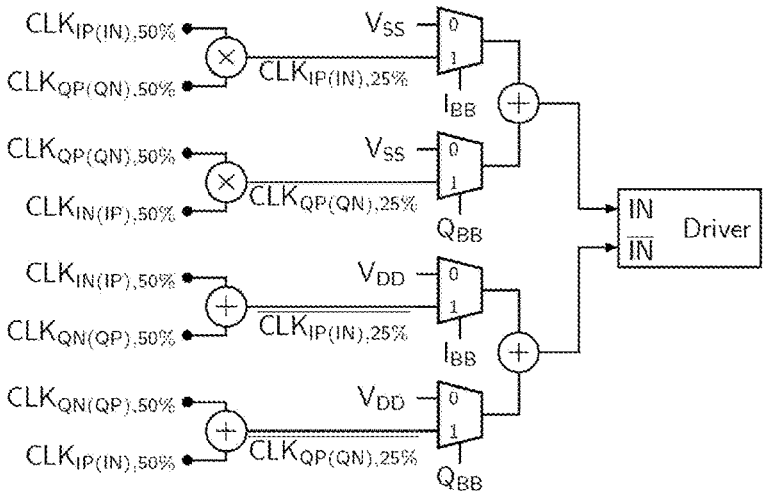

FIGS. 16A and 16B show logic circuitry and schematic diagrams of alternative embodiments for providing low duty-cycle clock signals for activating a unit cell using complementary signals. This additional logic circuitry may speed CMOS/SOI technologies are typically quite restricted in the voltage swing they can provide. Consequently, when driving LDMOS or GaN device using a CMOS or SOI DTX controller/driver, it can be very beneficial to create pseudo-differential driver signals, since they ease the implementation of a high speed driver configuration for this purpose. As an example of how to generate the essential complementary driver signals, the Cartesian DTX implementation with a phase mapper as discussed above with reference to FIG. 9B-C is extended to the configuration of FIG. 16A-B. Further alternative implementations, e.g. using De Morgan's laws are also possible. Furthermore, this concept can be extended beyond the signed IQ example given in FIG. 16A-B for multi-phase DTX implementations in a similar manner as discussed above.

In a further group of embodiments, a plurality of equi-phased clock signals are used, of which one or more of the plurality of equi-phased clock signals have a frequency which is an integer multiple of another one of the plurality of equi-phased clock signals, e.g. twice the frequency.

In one exemplary embodiment, instead of using two 50% clock signals at $f_0$ with a phase angle between the clock signals, a frequency difference between two 50% clock signals K1, K2 can be used to compose the reduced duty cycle. For example one 50% clock signal K2 at $f_0$ and one 50% clock signal K1 at $2 \times f_0$ can provide a 25% duty cycle resulting signal as indicated in the table below, using AND gating of the two clock signals (K1 AND K2):

| 25.0% | 1 | 1 | 0 | 0 | 0 | 0 | 0 | 0 | 1 | 1 | 0 | 0 | 0 | 0 | 0 | 0 |
|---|---|---|---|---|---|---|---|---|---|---|---|---|---|---|---|---|
| K1 | 1 | 1 | 0 | 0 | 1 | 1 | 0 | 0 | 1 | 1 | 0 | 0 | 1 | 1 | 0 | 0 |
| K2 | 1 | 1 | 1 | 1 | 0 | 0 | 0 | 0 | 1 | 1 | 1 | 1 | 0 | 0 | 0 | 0 |

| 25.0% | 0 | 0 | 1 | 1 | 0 | 0 | 0 | 0 | 0 | 0 | 1 | 1 | 0 | 0 | 0 | 0 |
|---|---|---|---|---|---|---|---|---|---|---|---|---|---|---|---|---|
| K1 | 0 | 0 | 1 | 1 | 0 | 0 | 1 | 1 | 0 | 0 | 1 | 1 | 0 | 0 | 1 | 1 |
| K2 | 1 | 1 | 1 | 1 | 0 | 0 | 0 | 0 | 1 | 1 | 1 | 1 | 0 | 0 | 0 | 0 |

| 25.0% | 0 | 0 | 0 | 0 | 1 | 1 | 0 | 0 | 0 | 0 | 0 | 0 | 1 | 1 | 0 | 0 |
|---|---|---|---|---|---|---|---|---|---|---|---|---|---|---|---|---|
| K1 | 1 | 1 | 0 | 0 | 1 | 1 | 0 | 0 | 1 | 1 | 0 | 0 | 1 | 1 | 0 | 0 |
| K2 | 0 | 0 | 0 | 0 | 1 | 1 | 1 | 1 | 0 | 0 | 0 | 0 | 1 | 1 | 1 | 1 |

| 25.0% | 0 | 0 | 0 | 0 | 0 | 0 | 1 | 1 | 0 | 0 | 0 | 0 | 0 | 0 | 1 | 1 |
|---|---|---|---|---|---|---|---|---|---|---|---|---|---|---|---|---|
| K1 | 0 | 0 | 1 | 1 | 0 | 0 | 1 | 1 | 0 | 0 | 1 | 1 | 0 | 0 | 1 | 1 |
| K2 | 0 | 0 | 0 | 0 | 1 | 1 | 1 | 1 | 0 | 0 | 0 | 0 | 1 | 1 | 1 | 1 |

Also, a combination of three clocks K1a, K1b, K2 can be used, where two faster clock signals K1a, K1b are used having a frequency twice the frequency of the slower clock signal K2, e.g. as shown in the tables below. in a first example, a 12.5% duty cycle signal is obtained using the K1a, K1b, and K2 clock signals connected in a 3-input AND-port (K1a AND K1b AND K2):

| 12.5% | 1 | 0 | 0 | 0 | 0 | 0 | 0 | 0 | 1 | 0 | 0 | 0 | 0 | 0 | 0 | 0 |
|---|---|---|---|---|---|---|---|---|---|---|---|---|---|---|---|---|
| K1a | 1 | 1 | 0 | 0 | 1 | 1 | 0 | 0 | 1 | 1 | 0 | 0 | 1 | 1 | 0 | 0 |
| K1b | 1 | 0 | 0 | 1 | 1 | 0 | 0 | 1 | 1 | 0 | 0 | 1 | 1 | 0 | 0 | 1 |
| K2 | 1 | 1 | 1 | 1 | 0 | 0 | 0 | 0 | 1 | 1 | 1 | 1 | 0 | 0 | 0 | 0 |

| 12.5% | 0 | 0 | 1 | 0 | 0 | 0 | 0 | 0 | 0 | 0 | 1 | 0 | 0 | 0 | 0 | 0 |
|---|---|---|---|---|---|---|---|---|---|---|---|---|---|---|---|---|
| K1a | 0 | 0 | 1 | 1 | 0 | 0 | 1 | 1 | 0 | 0 | 1 | 1 | 0 | 0 | 1 | 1 |
| K1b | 0 | 1 | 1 | 0 | 0 | 1 | 1 | 0 | 0 | 1 | 1 | 0 | 0 | 1 | 1 | 0 |
| K2 | 1 | 1 | 1 | 1 | 0 | 0 | 0 | 0 | 1 | 1 | 1 | 1 | 0 | 0 | 0 | 0 |

| 12.5% | 0 | 0 | 0 | 0 | 1 | 0 | 0 | 0 | 0 | 0 | 0 | 0 | 1 | 0 | 0 | 0 |
|---|---|---|---|---|---|---|---|---|---|---|---|---|---|---|---|---|
| K1a | 1 | 1 | 0 | 0 | 1 | 1 | 0 | 0 | 1 | 1 | 0 | 0 | 1 | 1 | 0 | 0 |
| K1b | 1 | 0 | 0 | 1 | 1 | 0 | 0 | 1 | 1 | 0 | 0 | 1 | 1 | 0 | 0 | 1 |
| K2 | 0 | 0 | 0 | 0 | 1 | 1 | 1 | 1 | 0 | 0 | 0 | 0 | 1 | 1 | 1 | 1 |

| 12.5% | 0 | 0 | 0 | 0 | 0 | 0 | 1 | 0 | 0 | 0 | 0 | 0 | 0 | 0 | 1 | 0 |
|---|---|---|---|---|---|---|---|---|---|---|---|---|---|---|---|---|
| K1a | 0 | 0 | 1 | 1 | 0 | 0 | 1 | 1 | 0 | 0 | 1 | 1 | 0 | 0 | 1 | 1 |
| K1b | 0 | 1 | 1 | 0 | 0 | 1 | 1 | 0 | 0 | 1 | 1 | 0 | 0 | 1 | 1 | 0 |
| K2 | 0 | 0 | 0 | 0 | 1 | 1 | 1 | 1 | 0 | 0 | 0 | 0 | 1 | 1 | 1 | 1 |

These embodiments using different frequency clock signals can be beneficial for larger phase shifts, as all phase shifts are implemented using 180 degree phase shifts in the K1 and K2 clocks (inverting the clock signal(s)).

It is noted that the above-mentioned exemplary embodiments can be extended to other combinations of different frequency clocks and other logic circuitries in order to implement different duty cycle clocks. It is apparent that alternative logic may be used to obtain the same results, e.g. using NOR logic gate circuitry.

The present invention has been described above with reference to a number of exemplary embodiments as shown in the drawings. Modifications and alternative implementations of some parts or elements are possible, and are included in the scope of protection as defined in the appended claims.

The invention claimed is:

1. A digitally controlled segmented RF power transmitter comprising a digital processing part and an RF power amplification part connected to the digital processing part, the RF power amplification part comprising a plurality of segments, each segment having an associated activation area, the segments being controlled by an activation scheme for activating specific ones of the segments with a segment driving signal depending on a code word received from the digital processing part, the digital processing part comprising a clock generation block being arranged to generate n equi-phased clock signals with a 50% duty-cycle, n being an integer value equal to or larger than 4, and a sign-bit phase mapper unit being arranged to receive the n equi-phased clock signals with the 50% duty-cycle, and to output a set of m, m≤n, phase-mapped clock signals with a 50% duty-cycle, wherein each of the plurality of segments comprises logic circuitry receiving the set of m phase-mapped clock signals with the 50% duty-cycle, the logic circuitry being arranged to provide the respective segment driving signal with a duty-cycle z of less than 50%.

2. The digitally controlled segmented RF power transmitter according to claim 1, wherein the logic circuitry is arranged to provide the respective segment driving signal by multiplying predetermined pairs of the set of m phase-mapped clock signals with the 50% duty-cycle.

3. The digitally controlled segmented RF power transmitter according to claim 1, wherein the logic circuitry comprises symmetrical logic circuit gates.

4. The digitally controlled segmented RF power transmitter according to claim 1, wherein n is equal to 4.

5. The digitally controlled segmented RF power transmitter according to claim 1, wherein the predetermined phase swapping scheme is dependent on the sign bits.

6. The digitally controlled segmented RF power transmitter according to claim 1, wherein the digital processing part further comprises a delay alignment unit operating on the n equi-phased clock signals with the 50% duty-cycle, the delay alignment unit being connected to inputs of the sign-bit phase mapper unit.

7. The digitally controlled segmented RF power transmitter according to claim 1, wherein the digital processing part further comprises a clock gating unit connected to outputs of the sign-bit phase mapper unit and arranged to block the m phase-mapped clock signals with the 50% duty-cycle if no predetermined data signal is present in the digital processing part.

8. The digitally controlled segmented RF power transmitter according to claim 1, wherein n is equal to 8.

9. The digitally controlled segmented RF power transmitter according to claim 8, wherein the logic circuitry is arranged to multiply predetermined pairs of the m phase-mapped clock signals with the 50% duty-cycle to obtain the respective segment driving signal with a duty-cycle of 12.5%.

10. The digitally controlled segmented RF power transmitter according to claim 8, wherein the logic circuitry is arranged to multiply predetermined pairs of the m phase-mapped clock signals with the 50% duty-cycle to obtain the respective segment driving signal with a duty-cycle of 25%.

11. The digitally controlled segmented RF power transmitter according to claim 8, wherein the logic circuitry is arranged to multiply predetermined pairs of the m phase-mapped clock signals with the 50% duty-cycle to obtain the respective segment driving signal with a duty-cycle of 37.5%.

12. The digitally controlled segmented RF power transmitter according to claim 1, wherein the plurality of segments are configured for interleaved operation.

13. The digitally controlled segmented RF power transmitter according to claim 1, wherein the plurality of segments are arranged to provide push-pull output signals.

14. The digitally controlled segmented RF power transmitter according to claim 1, wherein the RF power amplification part further comprises circuitry providing complementary signals to drive the plurality of segments.

15. The digitally controlled segmented RF power transmitter according to claim 1, wherein a plurality of equi-phased clock signals are used, of which one or more of the plurality of equi-phased clock signals have a frequency which is an integer multiple of another one of the plurality of equi-phased clock signals.

* * * * *